United States Patent
Yu et al.

(10) Patent No.: US 8,883,634 B2
(45) Date of Patent: Nov. 11, 2014

(54) PACKAGE INTERCONNECTS

(75) Inventors: Hong Yu, Singapore (SG); Huang Liu, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 0 days.

(21) Appl. No.: 13/171,478

(22) Filed: Jun. 29, 2011

(65) Prior Publication Data

US 2013/0001793 A1    Jan. 3, 2013

(51) Int. Cl.
*H01L 21/28* (2006.01)
*H01L 21/768* (2006.01)
*B81B 3/00* (2006.01)
*H01L 23/48* (2006.01)

(52) U.S. Cl.
CPC ........ *H01L 21/76898* (2013.01); *B81B 3/0072* (2013.01); *H01L 23/481* (2013.01); *B81B 2207/015* (2013.01); *B81B 2207/07* (2013.01)
USPC ........... 438/667; 438/107; 438/125; 438/629; 438/639; 257/774; 257/777; 257/622

(58) Field of Classification Search
USPC .................. 438/637, 638, 639, 640
See application file for complete search history.

(56) References Cited

U.S. PATENT DOCUMENTS

| | | | | |
|---|---|---|---|---|
| 7,402,515 B2* | 7/2008 | Arana et al. | | 438/639 |
| 7,666,768 B2* | 2/2010 | Raravikar et al. | | 438/487 |
| 8,097,964 B2* | 1/2012 | West et al. | | 257/786 |
| 8,168,529 B2* | 5/2012 | Lin et al. | | 438/622 |
| 8,227,902 B2* | 7/2012 | Kuo | | 257/659 |
| 2006/0290002 A1* | 12/2006 | Arana et al. | | 257/774 |
| 2009/0134500 A1* | 5/2009 | Kuo | | 257/659 |
| 2011/0147895 A1* | 6/2011 | Bai et al. | | 257/618 |
| 2012/0068313 A1* | 3/2012 | Pagaila et al. | | 257/621 |
| 2012/0292746 A1* | 11/2012 | Lee et al. | | 257/621 |
| 2013/0127019 A1* | 5/2013 | Lee et al. | | 257/621 |

OTHER PUBLICATIONS

A. Mercha et al., Comprehensive Analysis of the Impact of Single and Arrays of Through Silicon Vias Induced Stress on High-k/Metal Gate CMOS Performance, Electron Devices Meeting (IEDM), 2010 IEEE International, Dec. 6-8, 2010, pp. 2.2.1-2.2.4, San Francisco.

* cited by examiner

*Primary Examiner* — Julio J Maldonado
*Assistant Examiner* — Jaehwan Oh
(74) *Attorney, Agent, or Firm* — Horizon IP Pte. Ltd.

(57) ABSTRACT

A method for forming a device is disclosed. A substrate having first and second major surfaces is provided. A stress buffer is formed in the substrate. A through silicon via (TSV) contact is formed between the stress buffer. The stress buffer has a depth less than a depth of the TSV contact. The stress buffer alleviates stress created by the difference in coefficient thermal expansion (CTE) between the TSV contact and the substrate.

22 Claims, 43 Drawing Sheets

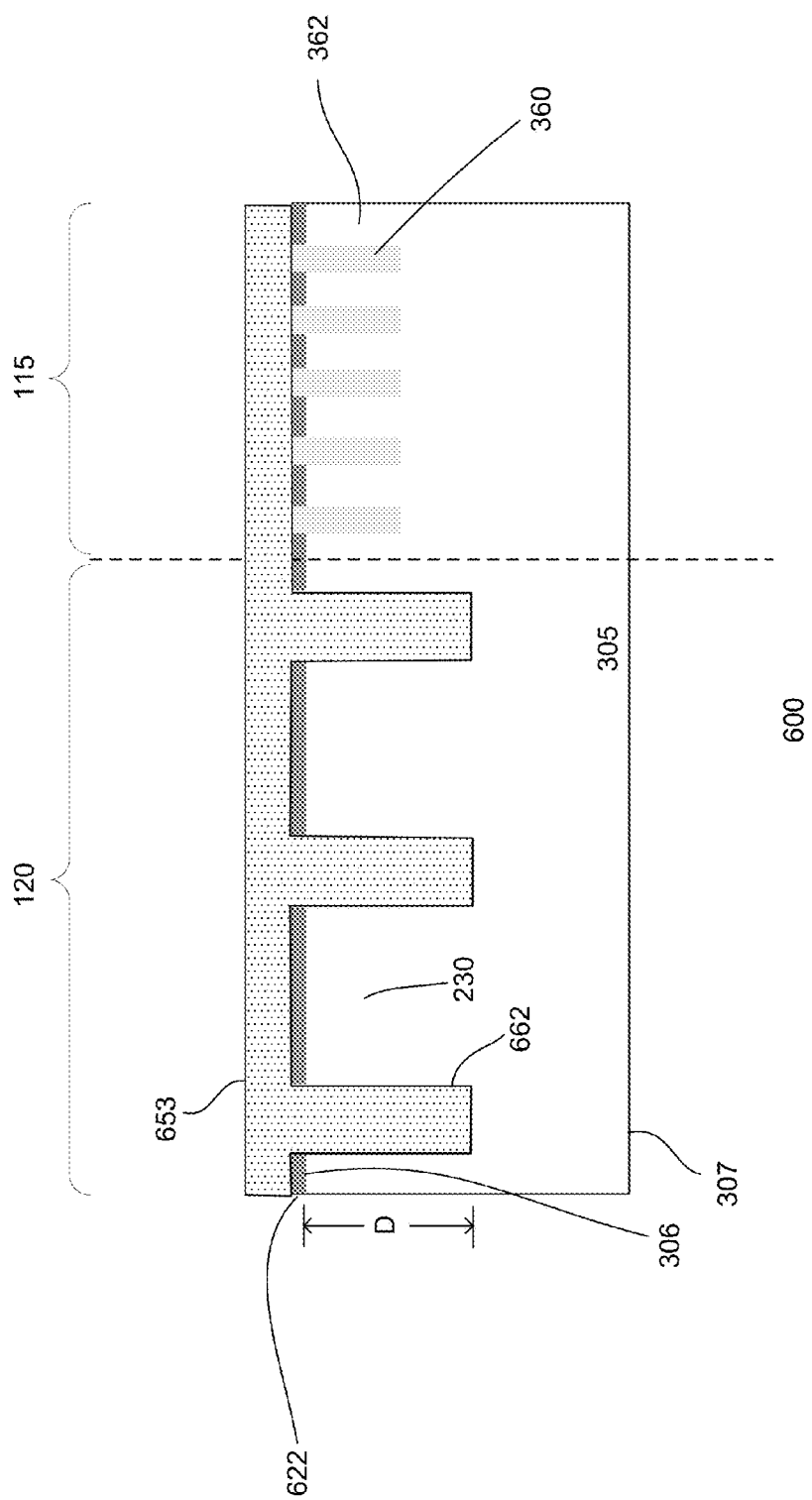

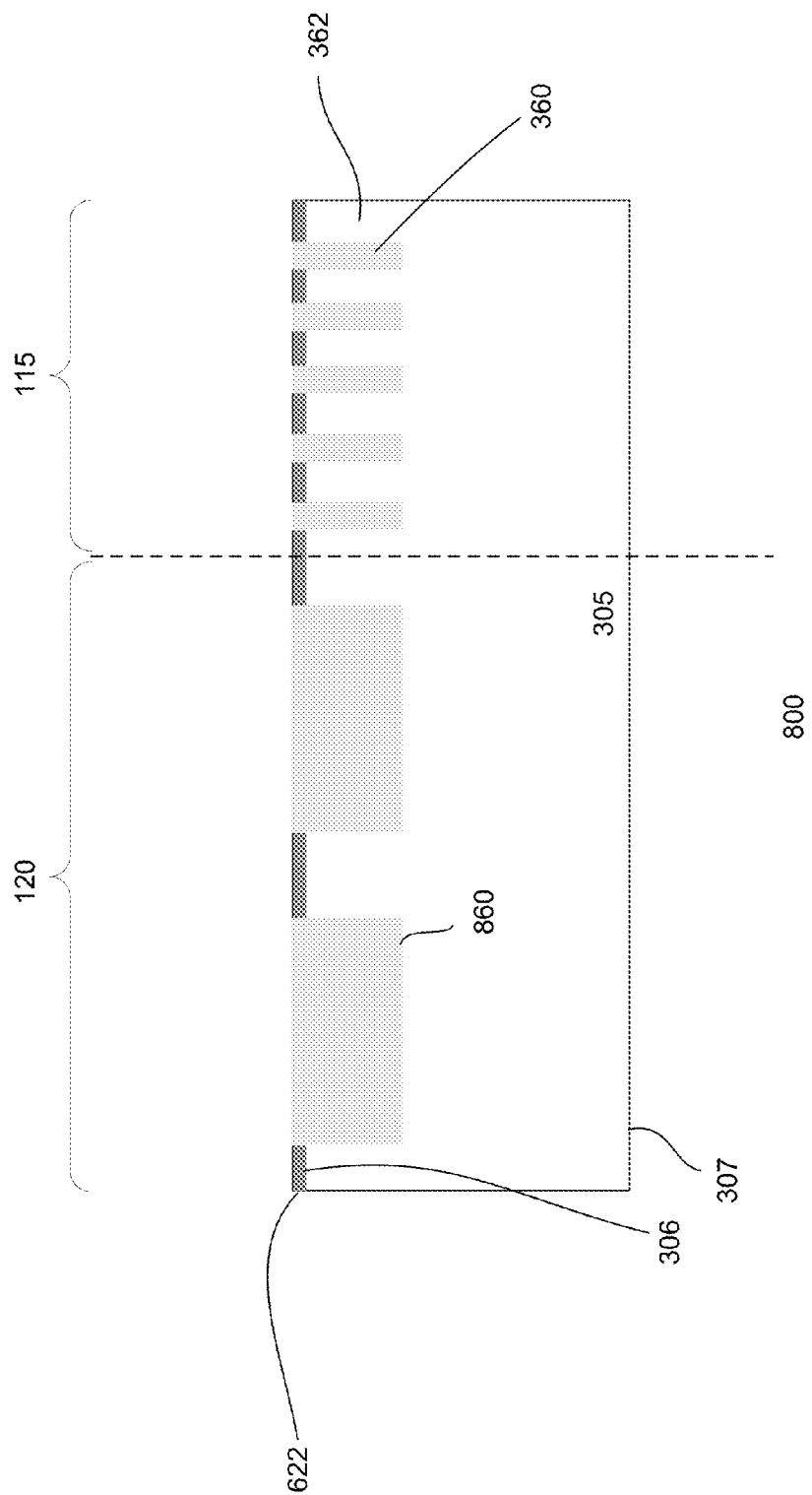

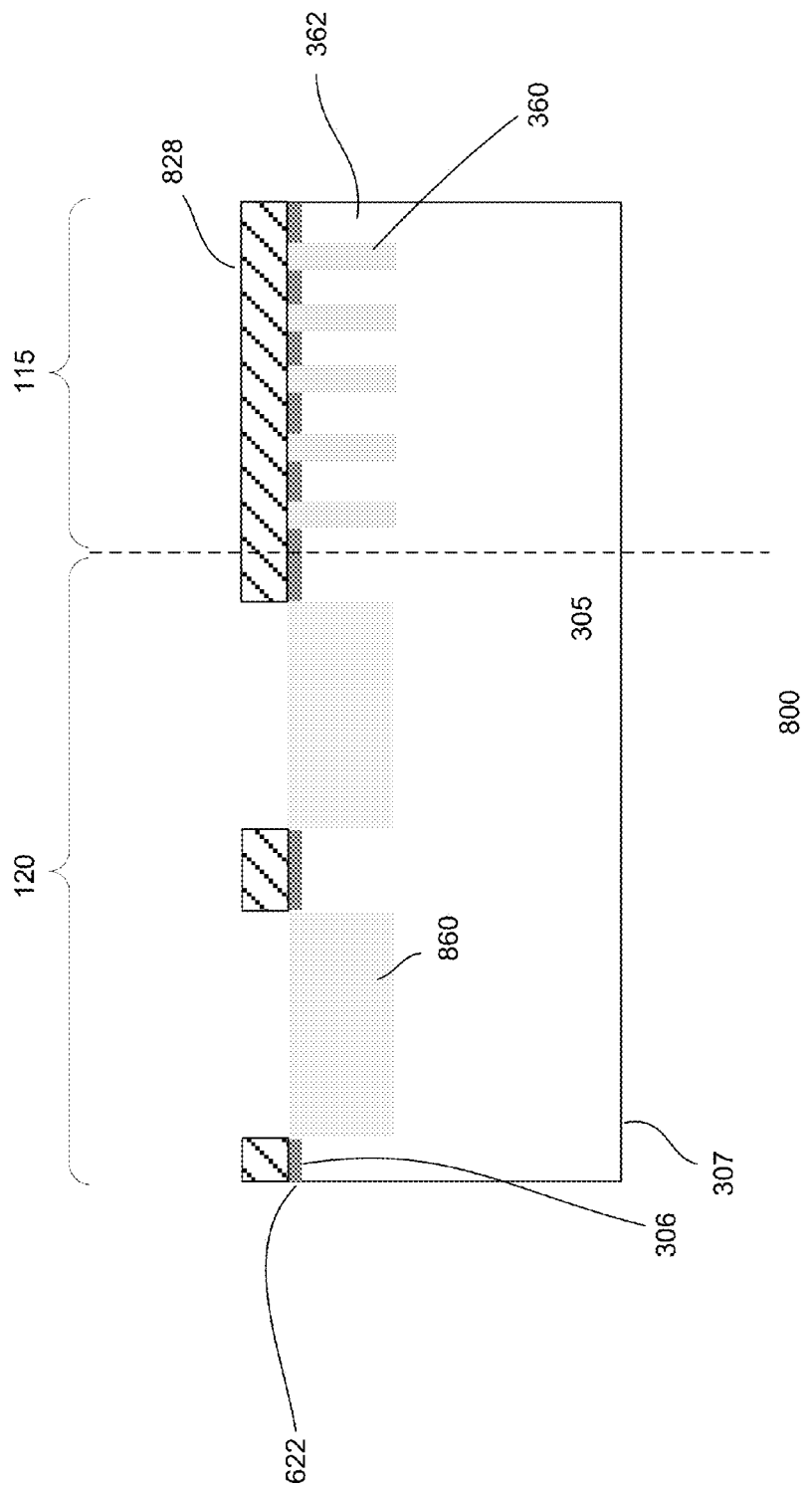

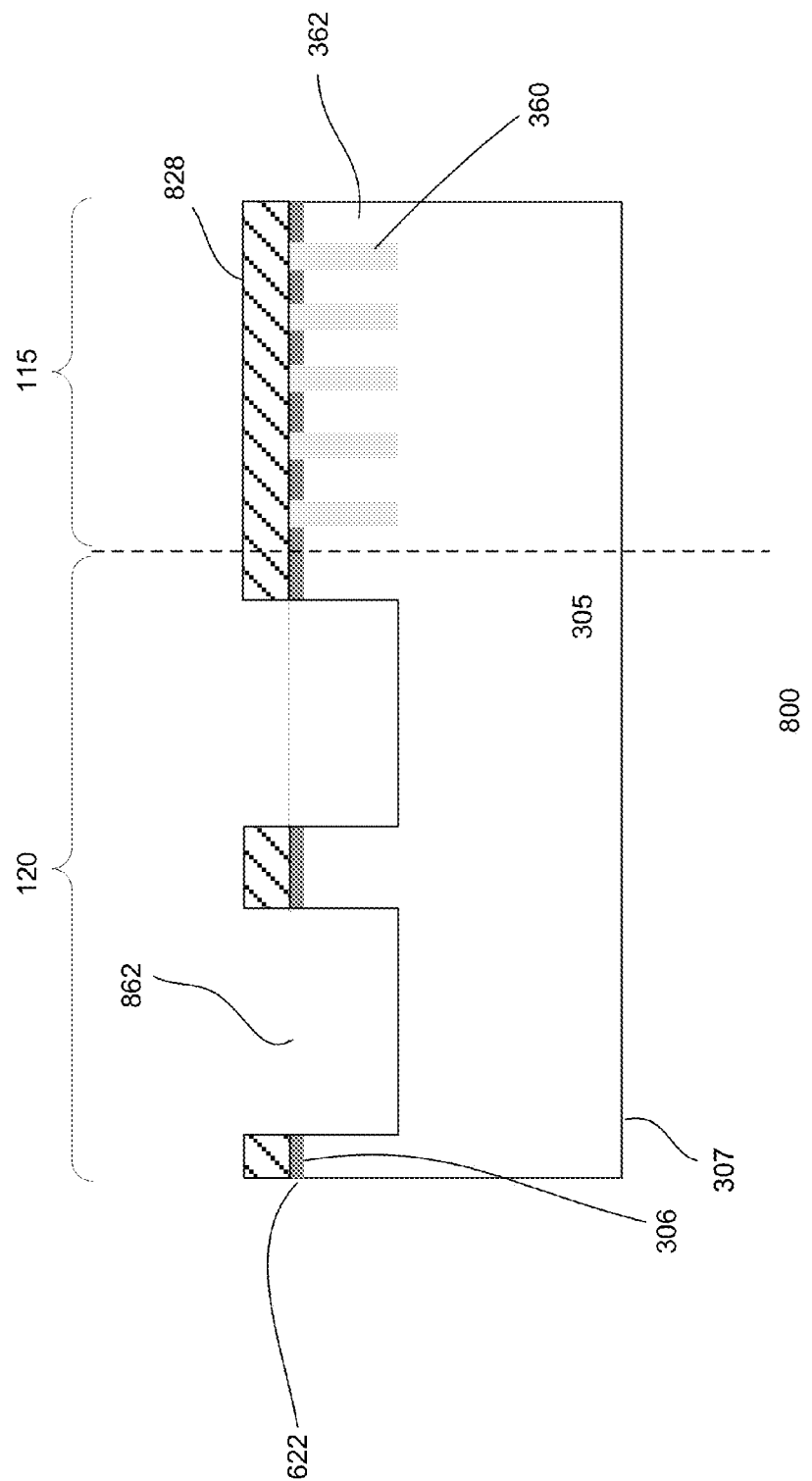

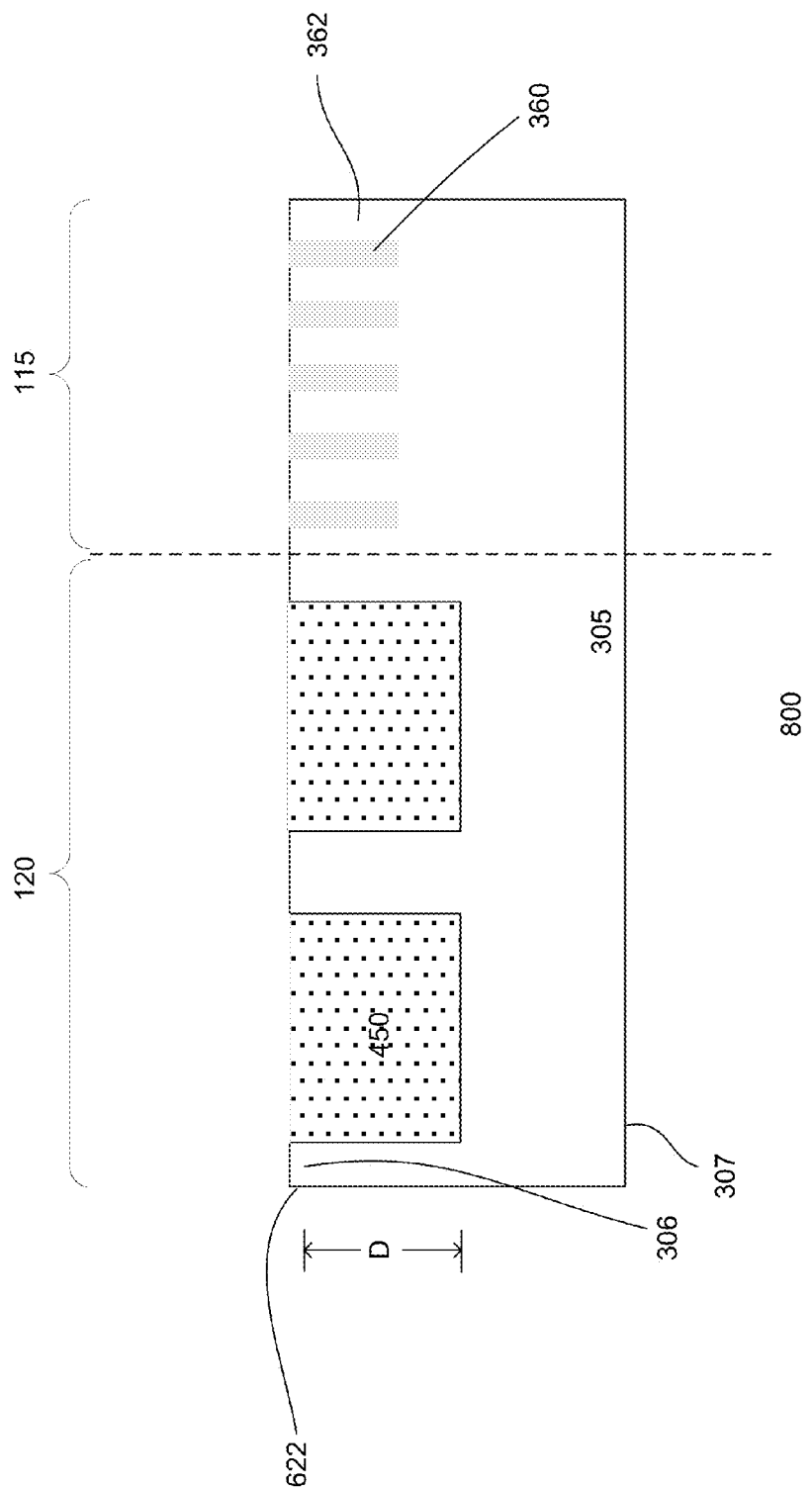

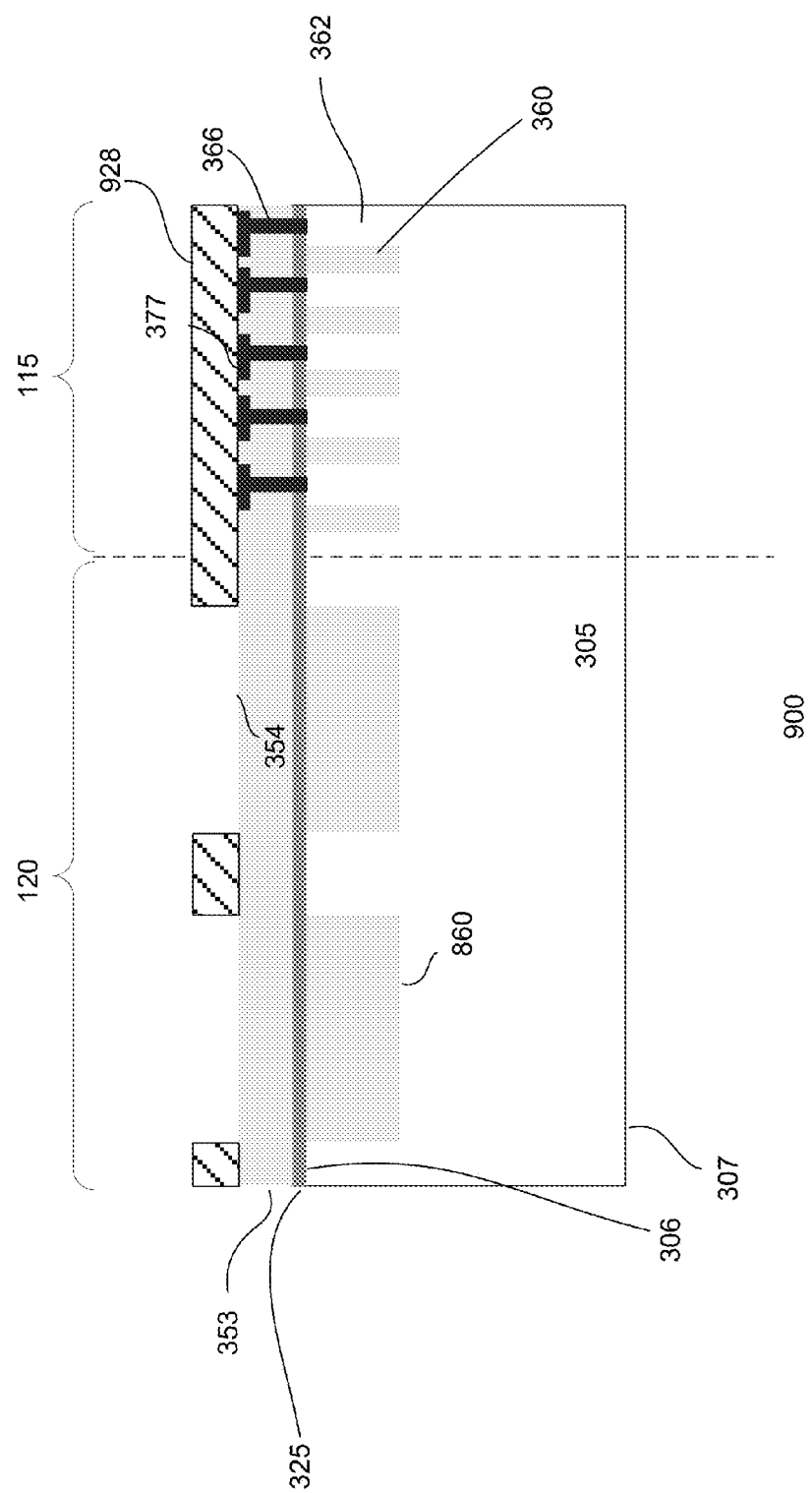

PACKAGE INTERCONNECTS

BACKGROUND

Wafer level packaging has been proposed to stack wafers together to produce extremely dense electronic packages. Through silicon via (TSV) process is one of the techniques used in wafer level packaging. It enables the production of small form factor devices and stacking of wafers to provide integration. Although TSV may provide higher reliability and less parasitic effect, it, however, has a high coefficient of thermal expansion (CTE) than the wafer substrate such as silicon. The CTE mismatch may result in significant stress in the substrate and the TSV. As such, TSV produces high stress which may impact yield and is also a relatively expensive technique. This reduces throughput and leads to an increase in the manufacturing cost of the devices.

It is desirable to provide packages with increased density, high reliability and low manufacturing cost.

SUMMARY

A method for forming a device is presented. In one embodiment, the method includes providing a substrate having first and second major surfaces. A stress buffer is formed in the substrate. The method further includes forming a through silicon via (TSV) contact between the stress buffer. The stress buffer has a depth less than a depth of the TSV contact and the stress buffer alleviates stress created by the difference in coefficient thermal expansion (CTE) between the TSV contact and the substrate.

In another embodiment, a device is disclosed. The device includes a substrate having first and second major surfaces. The device further includes a stress buffer in the substrate and a through silicon via (TSV) contact between the stress buffer. The stress buffer has a depth less than a depth of the TSV contact and the stress buffer alleviates stress created by the difference in coefficient thermal expansion (CTE) between the TSV contact and the substrate.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 6a-h show an embodiment of a process for forming a device;

FIGS. 8a-j show another embodiment of a process for forming a device; and

FIGS. 9a-i show another embodiment of a process for forming a device.

DETAILED DESCRIPTION

The embodiments generally relate to devices. The devices may be, for example, semiconductor devices. For example, the semiconductor devices may be integrated circuits. In other embodiments, the devices may be other types of devices, such as micro-electromechanical system (MEMS) devices. Embodiments may be employed to form stacked devices, for example, multiple devices stacked together to form a device stack. The device stack may include semiconductor devices. The devices of the stack need not be the same type of device. In other embodiments, the device stack may be hybrid stack which include a semiconductor and MEMS device. The devices may be incorporated into, for example, CMOS products. The devices may also be incorporated into other types of products.

Figure 1A:
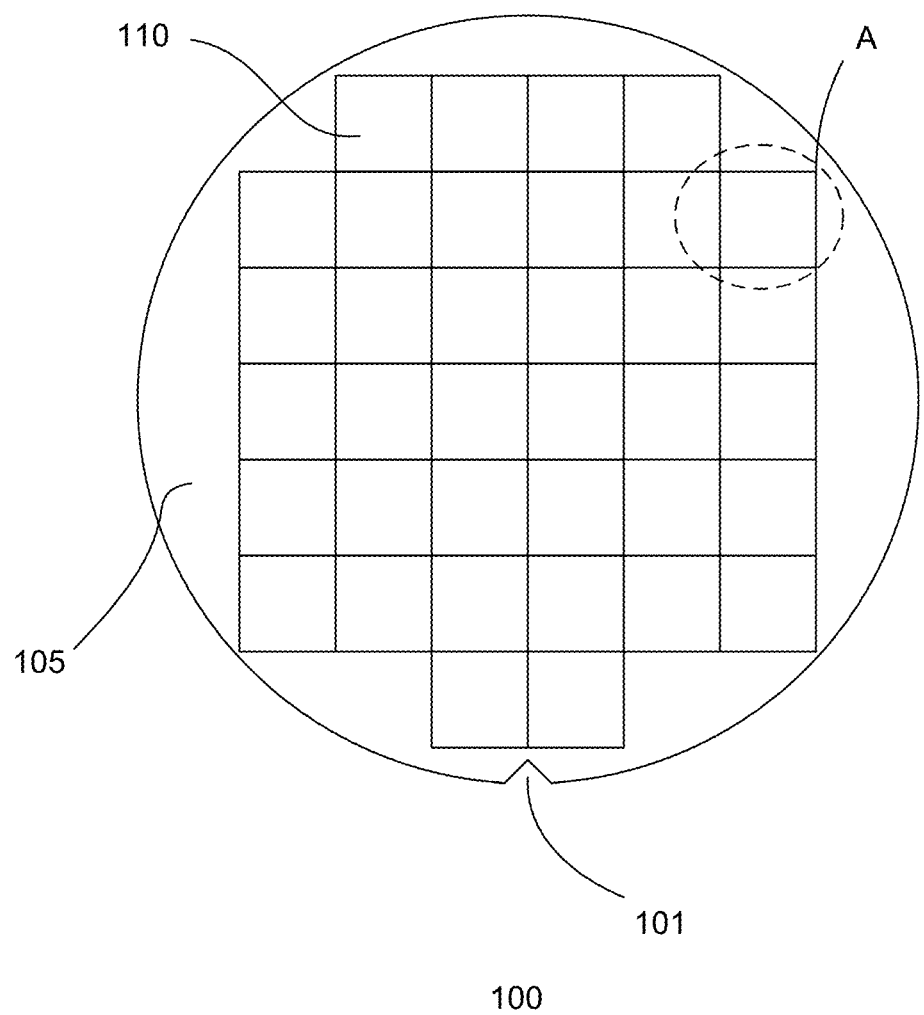
FIGS. 1a-b show an embodiment of a wafer with devices.

FIG. 1a shows a semiconductor wafer 100. The semiconductor wafer, for example, includes a silicon wafer. Other types of wafers are also useful. For example, the wafer may be a p-type, n-type, silicon-on-insulator or silicon germanium wafer. Depending on the type of device, the wafer may include a non-semiconductor material. The wafer may include a notch 101 to indicate the crystal orientation of the wafer. Other techniques for indicating the crystal orientation may also be useful. Additional indicators may also be included to indicate the dopant type of the wafer.

The wafer includes an active surface 105 on which devices 110 are formed. A plurality of devices may be formed on the wafer in parallel. The devices, for example, are arranged in rows along a first (x) direction and columns along a second (y) direction. The devices are subsequently singulated into individual dies, assembled and tested. In some embodiments, the wafer may be stacked with one or more other wafers to form a wafer stack. The stack of wafers is singulated to form die stacks.

Figure 1B:
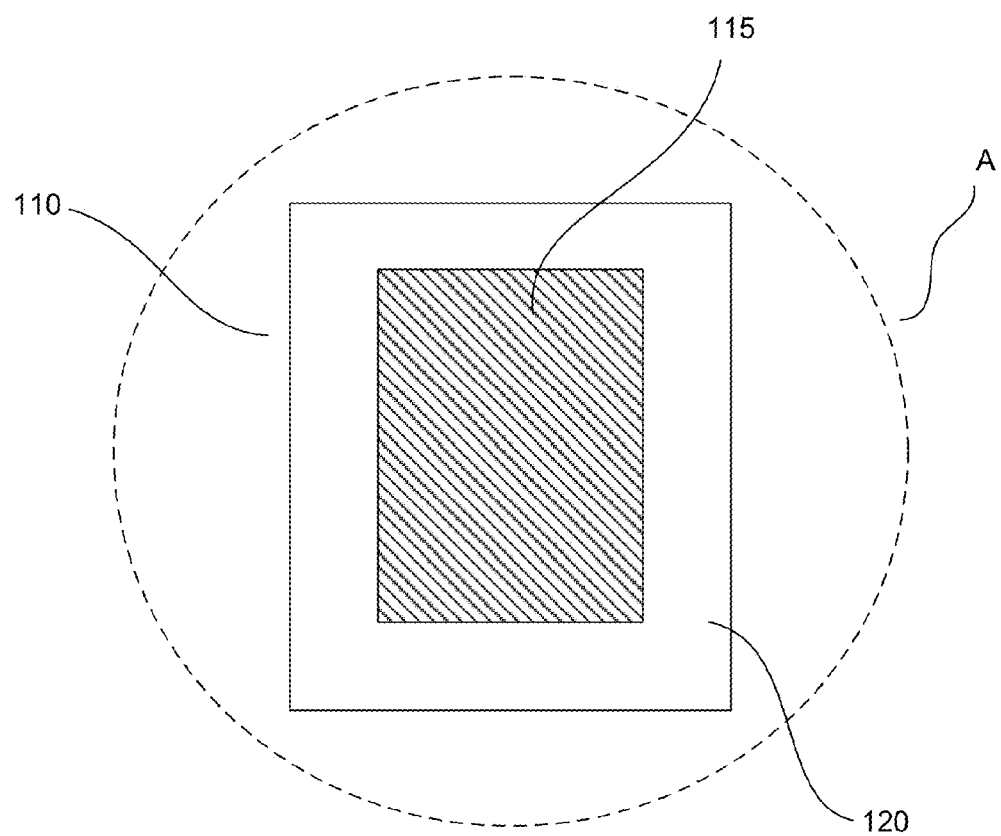

FIG. 1b shows a device 110 on the wafer in greater detail. As shown, the device includes first and second regions 115 and 120. The first region may be a device region and the second region may be a through silicon via (TSV) region. The device region includes components, such as transistors, of the device. The TSV region includes TSV contacts. TSV contacts, for example, are conductive contacts which extend from one major surface to the other of the wafer or substrate. Other types of components may be provided for the device and TSV regions. In one embodiment, the TSV region surrounds the device region. For example, the TSV region is a peripheral region of the device which surrounds the device region. Other configuration of the TSV and device regions may also be useful.

Figure 2A:
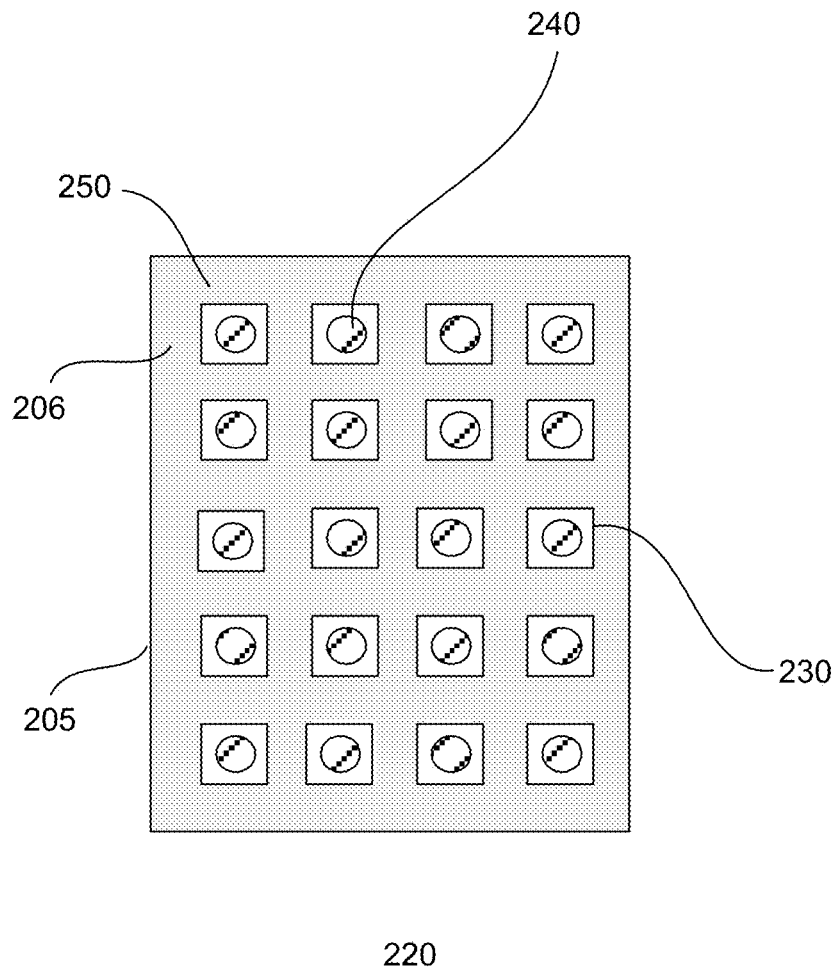
FIGS. 2a-b show plan views of embodiments of a TSV section of a device.
Figure 2B:
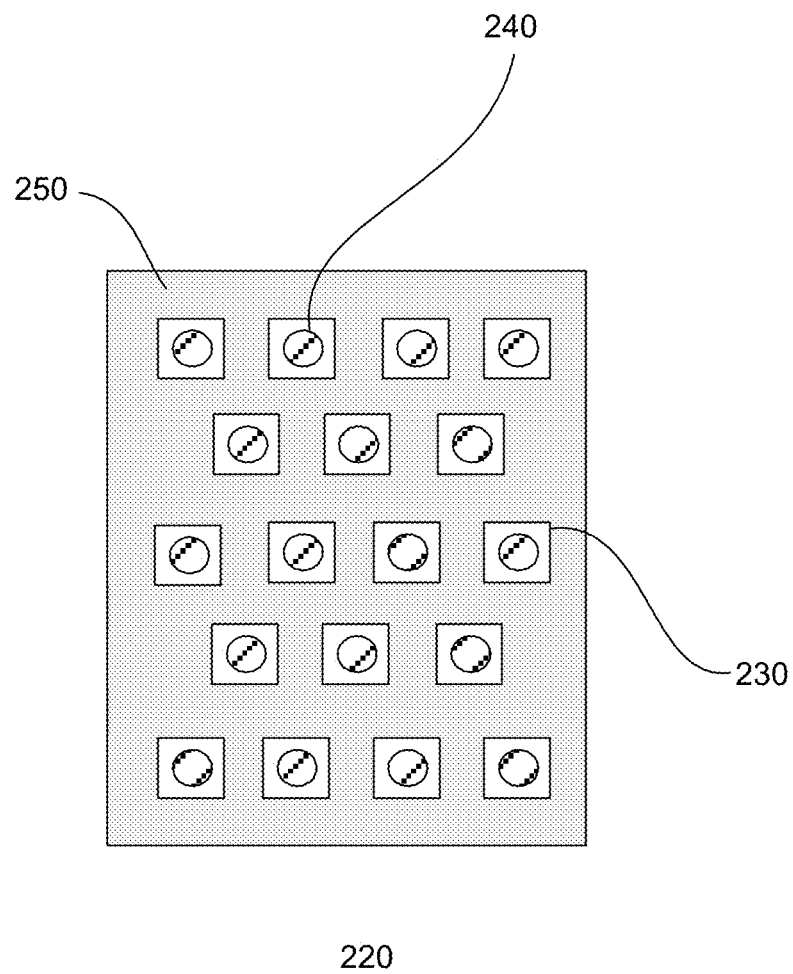

FIGS. 2a-b show plan views of portions 220 of embodiments of a TSV region of a device. The view is, for example, at a first surface 206 of a substrate 205. For example, the first surface may be a top surface of the substrate on which device components are formed.

In one embodiment, the TSV region includes a plurality of TSV active areas 230. The TSV active areas may be configured as isolated islands in which the TSV contacts are formed. For example, the isolated islands are part of the substrate in which the TSV contacts are formed. The TSV active areas may be disposed in an array or matrix format with rows and columns. In some embodiments, the rows and/or columns of active areas need not be aligned. For example, the active areas may be configured in a staggered arrangement, as shown in FIG. 2b. Providing other types of arrangements or configurations for the TSV active areas may also be useful.

TSV contacts 240 are disposed within the TSV active region. The TSV contacts, for example, include a conductive material, such as copper or copper alloy. Other types of conductive materials, such as aluminum, tungsten, gold, silver, tin, other metals, or alloys thereof may also be used to form the TSV contacts. Other types of materials, such as polysilicon, carbon nanotube or a combination of materials, may also be used to form the TSV contacts. The diameter of the TSV contacts, for example, may range from about 1 to 10 µm. Providing TSV contacts having diameters greater than 10 µm may also be useful. The depth of the TSV contacts, for example, may range from about 5 to 200 µm. Other depths for the TSV contacts may also be useful. In one embodiment, the size of the TSV contacts is about 5 µm (diameter)×50 µm (depth). Providing the TSV contacts having other sizes may also be useful.

One or more stress buffers 250 are disposed in the TSV region. As shown, the stress buffers surround the TSV active region. For example, the stress buffers are configured in rows in a first direction and columns in a second direction to isolate the TSV active regions. Other configurations of stress buffers and TSV active areas or TSV contacts may also be useful. For example, the stress buffers may be provided as elongated buffer structure disposed in one of the first or second direction, such as columns or rows to separate elongated TSV active areas. The elongated structure need not be straight and may include curves, depending on the desired TSV contact arrangement. In other embodiments, the stress buffers may be isolated island structures dispersed between TSV contacts of a combination of elongated buffer structures and isolated buffer island structures.

In yet other embodiments, the stress buffers may occupy the TSV region to completely surround the TSV contacts. For example, the stress buffers may completely occupy the TSV region and abut the TSV contacts. Alternatively, the stress buffers partially occupy the TSV region and abut the TSV contacts.

The stress buffers alleviate stress created by the difference in coefficient of thermal expansion (CTE) between the TSV contact and substrate materials. The material of the stress buffers should have a low elastic modulus, such as less than about 100 GPa, and low hardness to absorb the thermal stress caused by CTE mismatch of the TSV contact and substrate materials. For example, materials such as polymer, plastic, organic or inorganic dielectrics, porous dielectric material such as porous glass, or a combination thereof may be used for the stress buffers. Other types of materials may also be useful.

Figure 3A:
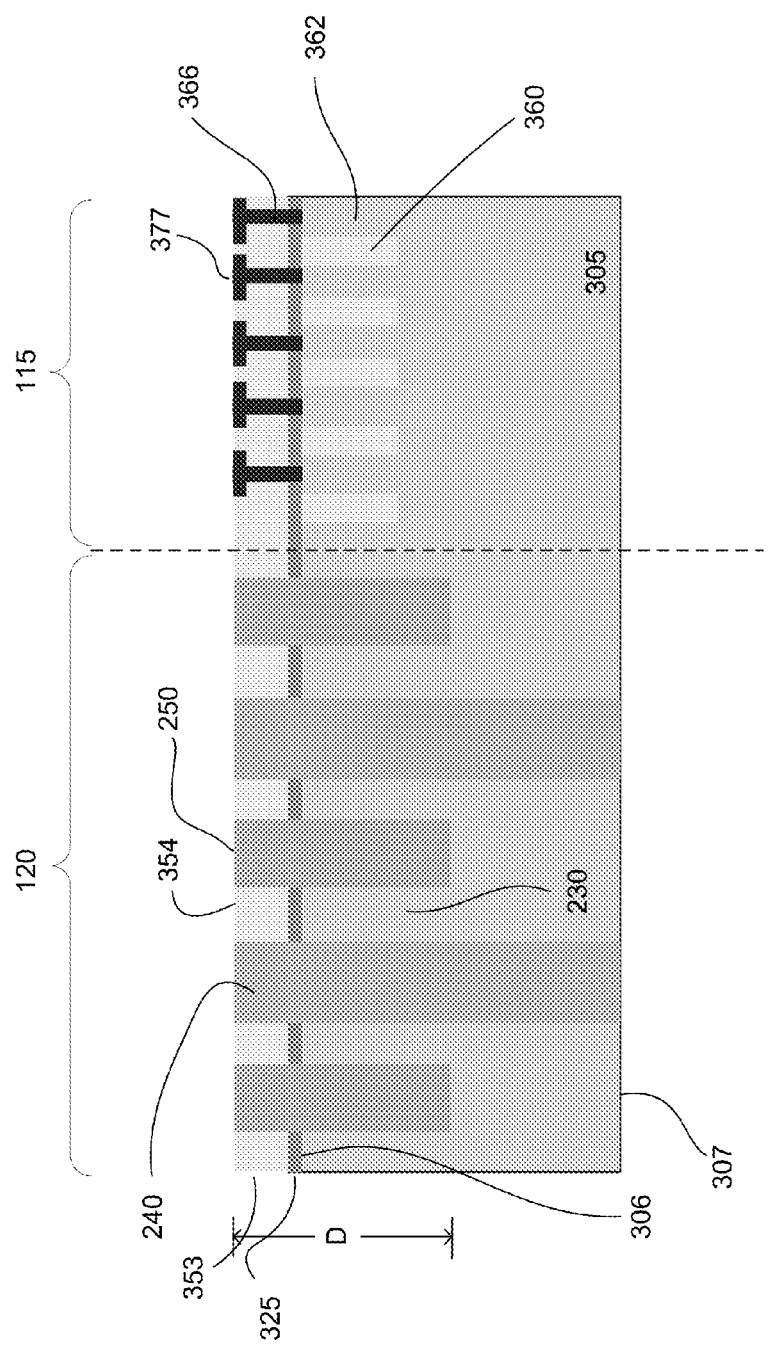
FIGS. 3a-b show simplified cross-section views of embodiments of a device.
Figure 3B:
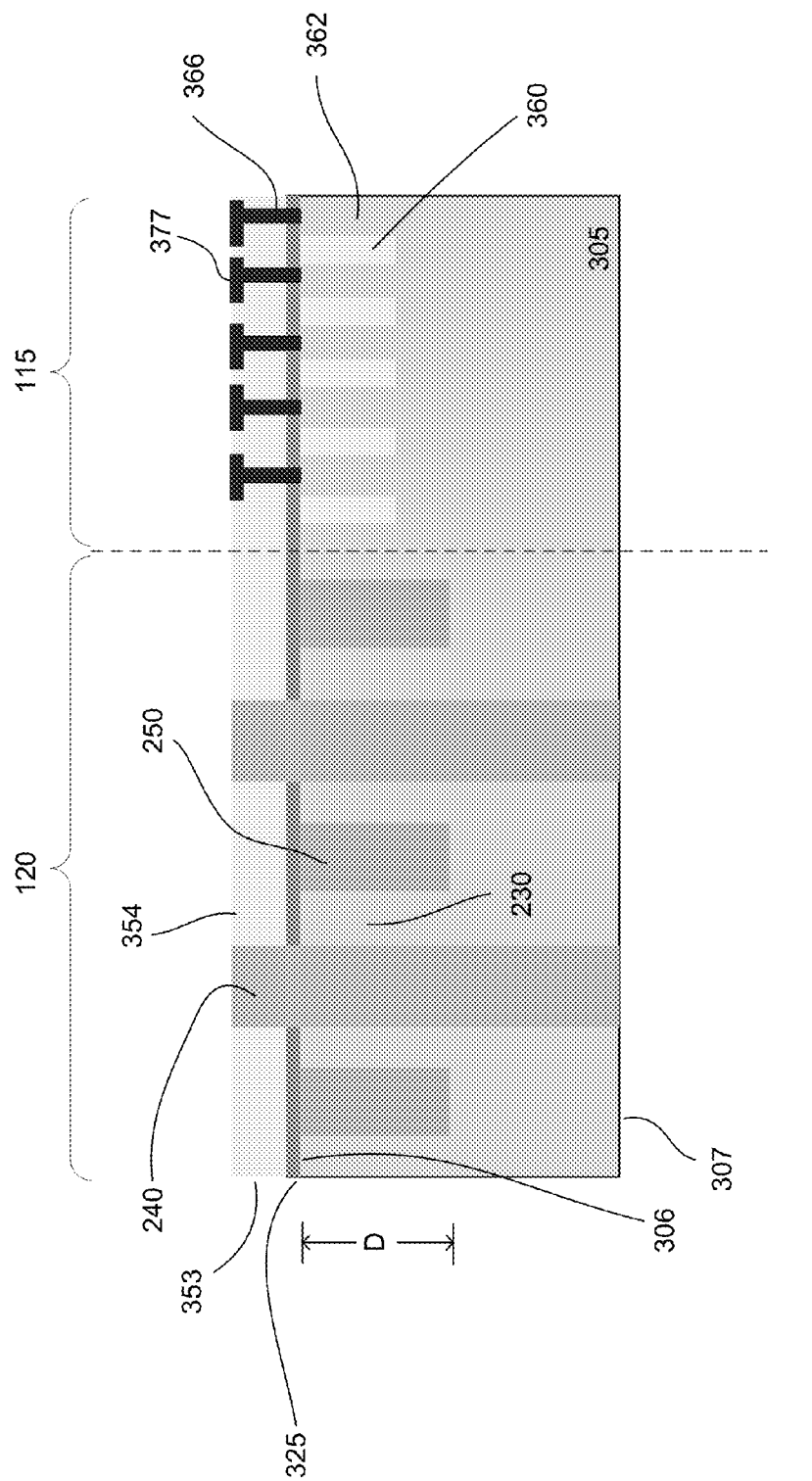

FIGS. 3a-b show simplified cross-sectional views of portions of embodiments of a device 300. The device includes a substrate 305. The substrate, for example, may include a semiconductor material, such as a crystalline material. For example, the substrate may include silicon. Other types of semiconductor materials, such as silicon-germanium (SiGe), germanium (Ge), gallium-arsenic (GaAs) or any other suitable semiconductor materials, including subsequently developed materials, may also be used as the substrate. The initial thickness of the substrate, for example, may be about 500 to 800 µm. The substrate may be processed to have a final thickness of the substrate, for example, about 200 µm. In other embodiments, the final thickness of the substrate may be about 5-200 µm. Providing substrates with other thicknesses may also be useful. For example, the initial and final thicknesses may vary, depending on the methodology used and the depth of the TSV contacts which are formed. The substrate may be a doped substrate. For example, the substrate may be a p-type or n-type doped substrate.

The device includes a device region 115 and a TSV region 120. Other regions may also be provided for the device. In one embodiment, the TSV region is a peripheral region of the device. For example, the TSV region surrounds the device region. Other configurations of the device and TSV regions may also be useful.

The device region may include active regions 362 on the substrate separated by isolation regions 360. The active region may include device components (not shown). Device wells may be provided in the active region. The polarity of the device wells depends on, for example, the polarity of the device. For example, first polarity devices are formed in second polarity wells. Various types of device components, such as transistors, may be provided in the active regions. For example, gate conductors may be provided on a first substrate surface 306 which traverses active regions, and source/drain (S/D) regions may be provided in the active regions. Other types of components such as capacitors or resistors may also be included. The first substrate surface, for example, may be the top surface of the substrate.

An etch stop layer 325 is provided over the components. The etch stop layer, for example, includes a dielectric material, such as silicon nitride. In some embodiments, the etch stop layer may be a composite etch stop layer having multiple layers. Other types of etch stop layers or materials may also be useful. A dielectric layer 353 is disposed over the etch stop layer. The dielectric layer serves as an interlevel dielectric (ILD) layer having interconnects, including contacts 366 and conductive lines 377. The contacts, for example, extend through the etch stop layer to provide connections to the interconnects. The device may include multiple interconnect levels. The components and interconnections may be formed using complementary metal oxide semiconductor (CMOS) processes to produce, for example, an IC or CMOS device.

In other embodiments, the device region may include other types of components. For example, the device may include electrical and mechanical components to form a micro-electromechanical system (MEMS) device.

The TSV region includes a plurality of TSV contacts 240. The TSV contacts are formed in TSV active areas 230 in the TSV region. The TSV contacts extend from a first surface 354 of the dielectric layer to the second surface 307 of the substrate. The first surface of the dielectric layer, for example, may be the top surface of the dielectric layer while the second surface of the substrate may be the bottom surface of the substrate. In one embodiment, the second surface of the substrate includes a grounded surface. The grounded surface, for example, results from back grinding to expose the bottom surface of the TSV contacts. The TSV contacts include a conductive material. In one embodiment, the TSV contacts include a metal, such as copper or copper alloy. Other types of conductive materials, such as aluminum, tungsten, gold, silver, tin, as well as other types of metals or alloys thereof, may also be useful. Other types of materials, such as polysilicon, carbon nanotube, or a combination of materials, may also be used to form the TSV contacts.

The TSV contacts may be arranged in a matrix or array format with rows and columns. In some embodiments, the rows and/or columns of contacts need not be aligned. For example, the contacts may be configured in a staggered arrangement. Other types of arrangements for the TSV contacts may also be useful.

Stress buffers 250 are disposed in the TSV region. The stress buffers alleviate stress created by the difference in coefficient of thermal expansion (CTE) between the TSV contact and substrate materials. The material of the stress buffers should have a low elastic modulus, such as less than about 100 GPa and low hardness to absorb the thermal stress caused by CTE mismatch of the TSV contact and substrate materials. For example, materials such as polymer, plastic, organic or inorganic dielectrics, porous dielectric material, porous glass or a combination thereof may be used for the stress buffers. Other types of materials may also be useful.

The stress buffers, for example, are disposed in the TSV region between the TSV active areas. The width of the stress buffers, for example, may be equal to the spacing between the TSV active areas. The width of the stress buffers, for example, may be about 100 nm to 5 μm, depending on the size of the TSV contacts formed. The stress buffers extend partially into the substrate to a depth D measured from the first or top surface 354. The depth D should be sufficient to alleviate stress caused by the CTE mismatch of the TSV contact and substrate materials. In one embodiment, the depth of the stress buffers is different than the depth of the TSV contacts. The depth of the stress buffers, for example, is less than the depth of the TSV contact. In one embodiment, the depth D is about 300 nm to 30 μm. Other widths and depths which the stress buffers extend partially into the substrate may also be useful.

The stress buffers may be elongated structures disposed in the TSV region, forming rows and columns which isolate the TSV active areas. In other embodiments, the stress buffers may be elongated structures in either the row direction or column direction or isolated islands or a combination thereof.

In one embodiment, as shown in FIG. 3a, the stress buffers extend from a first surface 354 of the dielectric layer to a depth D into the substrate. In an alternative embodiment, the stress buffers extend from the first surface 306 of the substrate to a depth D, as shown in FIG. 3b.

Figure 4A:
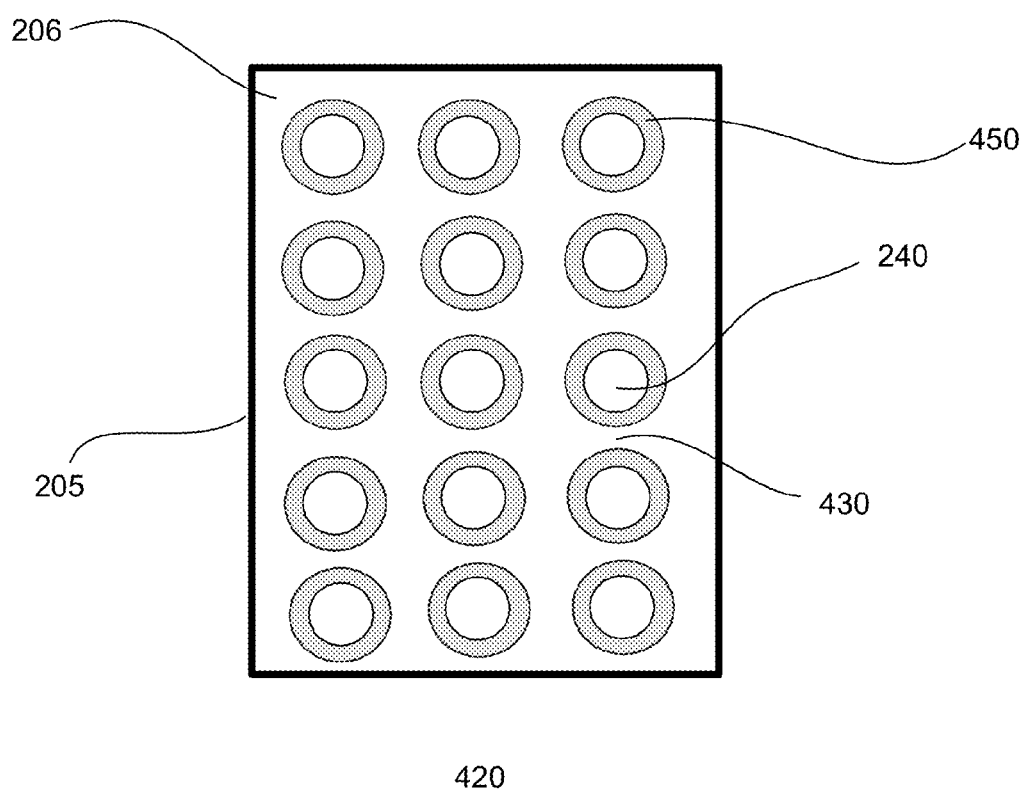
FIGS. 4a-b show plan views of other embodiments of a TSV section of a device.
Figure 4B:
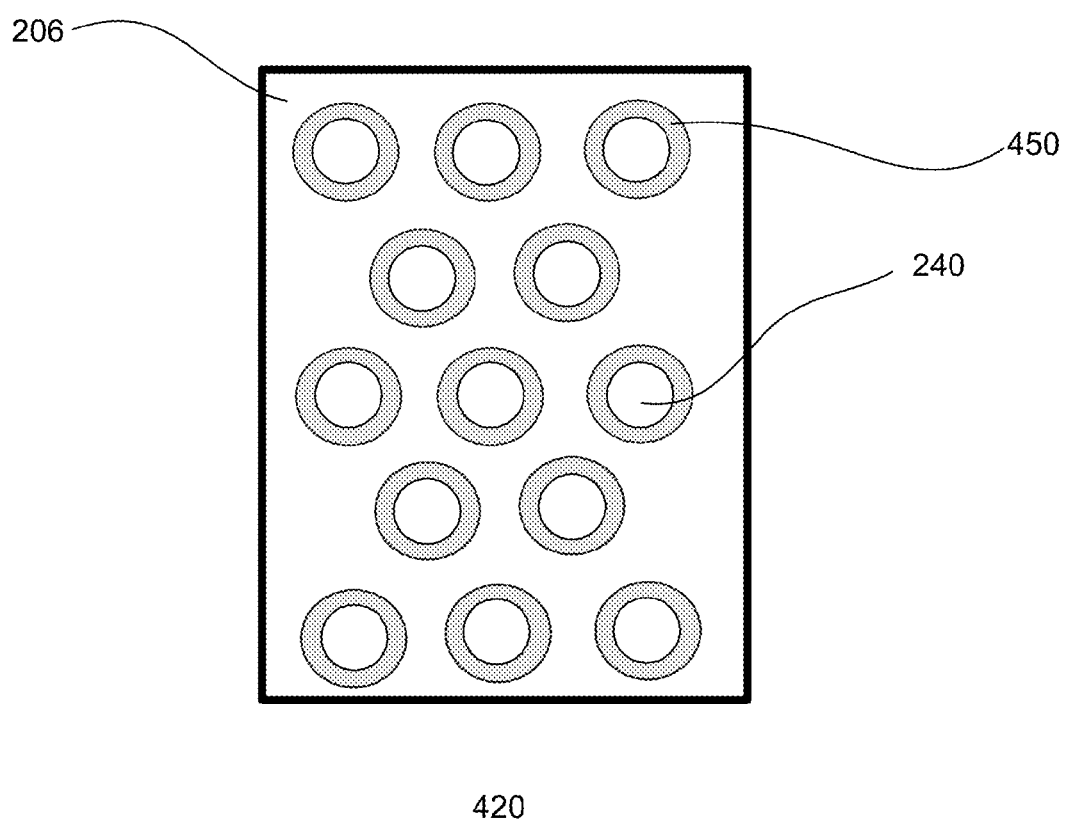

FIGS. 4a-b show plan views of portions 420 of embodiments of a TSV region of a device. The view is, for example, at a first surface 206 of a substrate 205. The first surface may be a top surface of the substrate on which device components are formed. The device is similar to that described in FIGS. 2a-b. As such, common elements need not be described or described in detail.

The TSV region includes a plurality of TSV contacts 240. The TSV contacts, for example, include a conductive material, such as copper or copper alloy. Other types of conductive materials, such as aluminum, tungsten, gold, silver, tin, other metals, or alloys thereof may also be used to form the TSV contacts. Other types of materials, such as polysilicon, carbon nanotube, or a combination of materials, may also be used. The TSV contacts may be disposed in an array or matrix format with rows and columns. In some embodiments, the rows and/or columns of contacts need not be aligned. For example, the contacts may be configured in a staggered arrangement, as shown in FIG. 4b. Providing other types of arrangements or configurations for the TSV contacts may also be useful.

As shown, the TSV contacts include a circular shape. Providing TSV contacts having other shapes may also be useful. For example, the TSV contacts may be rectangular or other geometric shapes. In one embodiment, the size of the TSV contacts is about 5 μm (diameter)×50 μm (depth). Providing the TSV contacts having other sizes may also be useful.

Stress buffers 450 are disposed in the TSV region. In one embodiment, stress buffers surround the TSV contacts. For example, a TSV contact is disposed within a stress buffer. A stress buffer and the TSV contact which it surrounds form a TSV contact unit. The TSV contact units are separated from other TSV contact units by substrate portions 430.

In one embodiment, the TSV contacts and stress buffers include the same or similar shape. Providing TSV contacts and stress buffers with the same shape advantageously enables the use of the same reticle to form both the stress buffers and TSV contacts. The same reticle may be used with different CD printing to pattern the substrate to form the stress buffers and TSV contacts. For example, the reticle may print with larger CD for the stress buffers and smaller CD for the TSV contacts. This may be used to form the TSV contacts concentrically within the stress buffers. The use of more than one reticle, such as two reticles, for forming the TSV contacts and stress buffers may also be useful. In other embodiments, the stress buffer and TSV contacts may include different shapes. The diameter of the TSV contacts, for example, may range from about 1 μm to 10 μm. Providing TSV contacts with other diameters, for example, greater than 10 μm, may also be useful. In one embodiment, the diameter of the TSV contacts is about 5 μm. The total width of the TSV contact unit (TSV contact and stress buffer) may range from 5 to 10 μm, depending on the size of the TSV contacts. Providing TSV contact units having other sizes, such as greater than 10 μm, may also be useful.

Figure 5A:
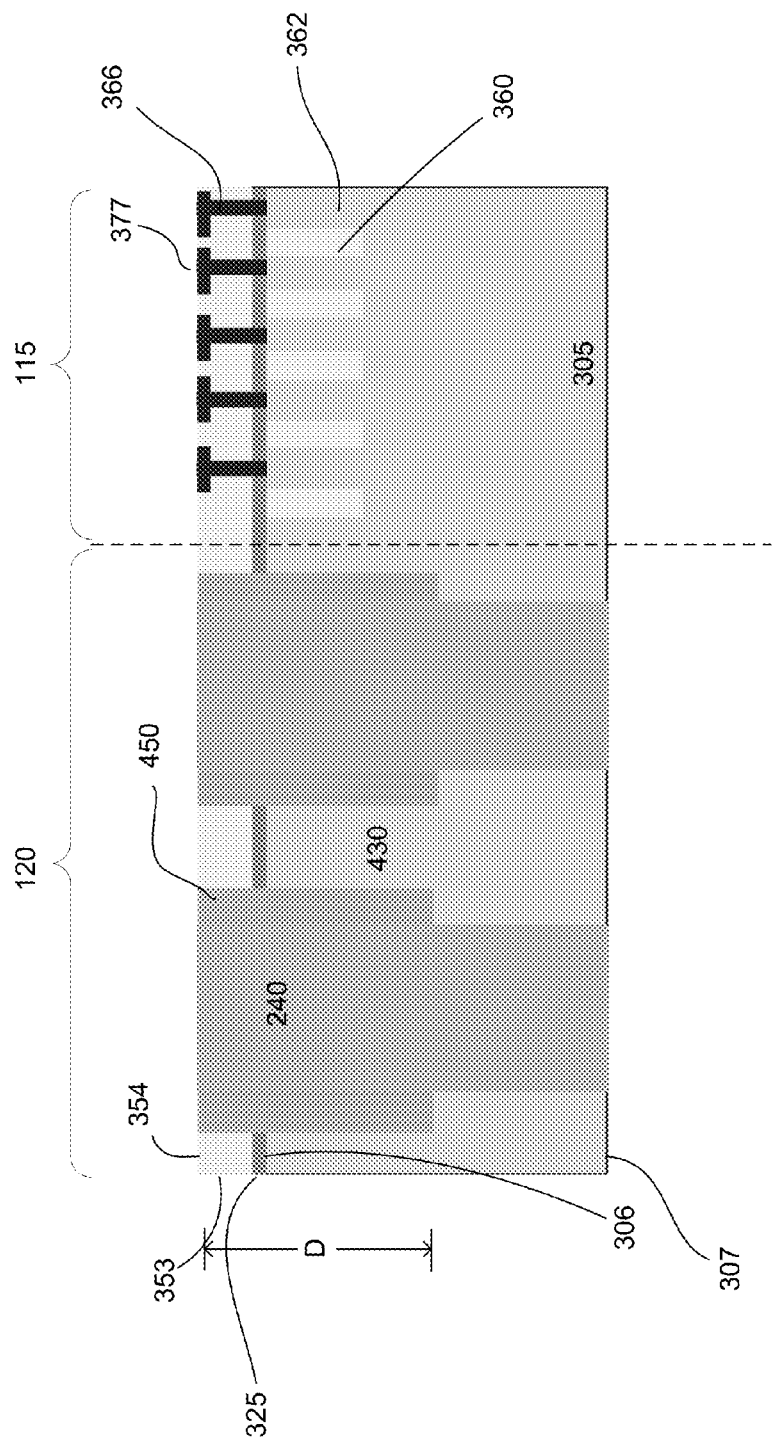
FIGS. 5a-b show simplified cross-section views of other embodiments of a device.
Figure 5B:
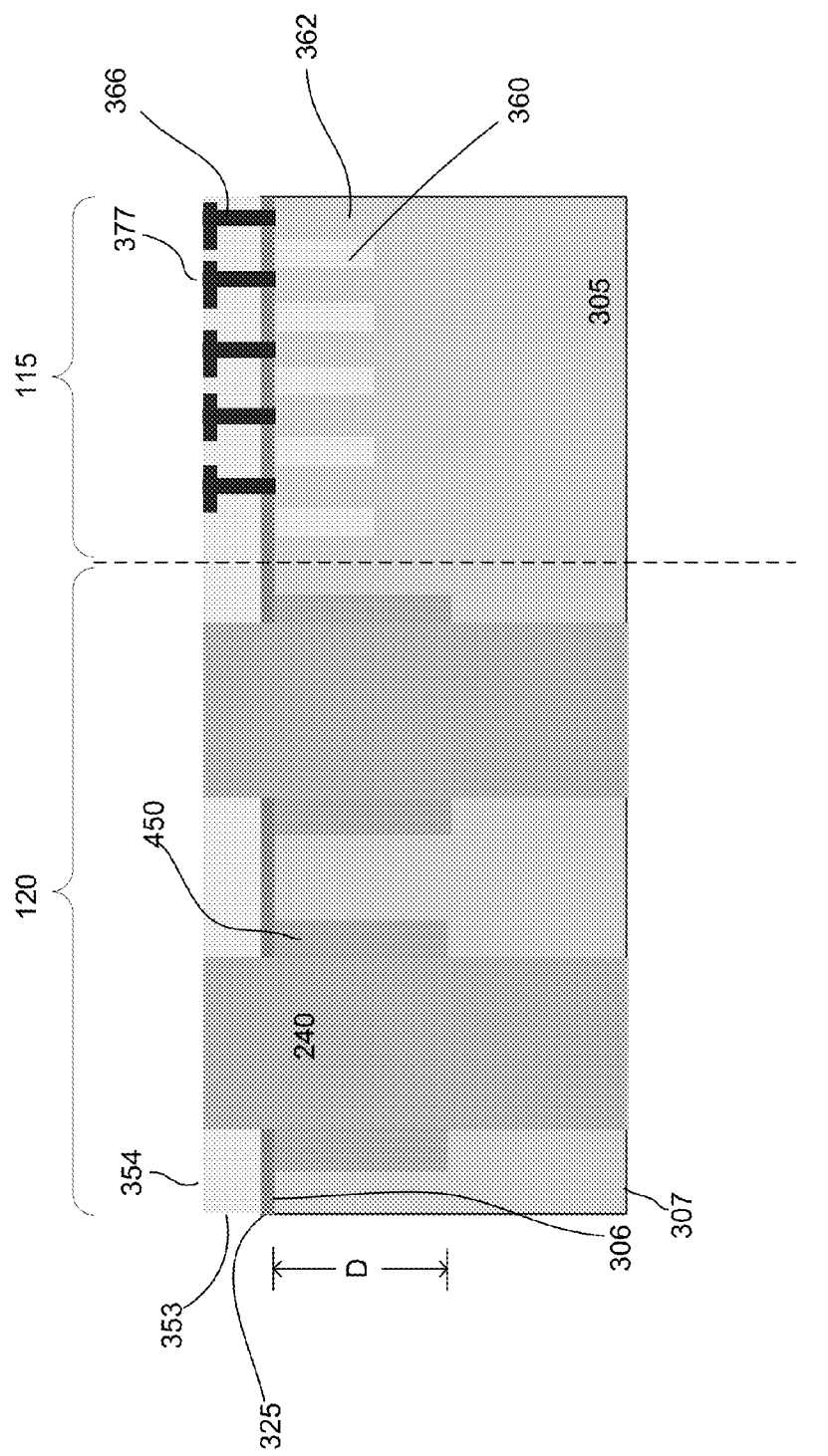

FIGS. 5a-b show simplified cross-sectional views of portions of embodiments of a device 500. The device is similar to that described in FIGS. 3a-b. As such, common elements need not be described or described in detail. The device includes a substrate 305 with a device region 115 and a TSV region 120. Other regions may also be provided for the device. In one embodiment, the TSV region is a peripheral region of the device. For example, the TSV region surrounds the device region. Other configurations of the device and TSV regions may also be useful.

The TSV region includes a plurality of TSV contacts 240. The TSV contacts extend from a first surface 354 of the dielectric layer 353 to the second surface 307 of the substrate. The TSV contacts include a conductive material. The TSV contacts, for example, include a conductive material, such as copper or copper alloy. Other types of conductive materials, such as aluminum, tungsten, gold, silver, tin other metals, or alloys thereof may also be used to form the TSV contacts. Other types of materials such as polysilicon, carbon nanotube, or a combination of materials, may also be useful.

The TSV contacts may be arranged in a matrix or array format with rows and columns. In some embodiments, the rows and/or columns of contacts need not be aligned. For example, the contacts may be configured in a staggered arrangement. Other types of arrangements for the TSV contacts may also be useful.

Stress buffers 450 are disposed in the TSV region. The stress buffers alleviate stress created by the difference in coefficient of thermal expansion (CTE) between the TSV contact and substrate materials. The material of the stress buffers should have a low elastic modulus, such as less than about 100 GPa and low hardness to absorb the thermal stress caused by CTE mismatch of the TSV contact and substrate materials. The stress buffers, for example, may include materials such as polymer, plastic, organic or inorganic dielectrics, porous dielectric material, porous glass or a combination thereof. Providing the stress buffers with other types of materials may also be useful.

Stress buffers 450 are disposed in the TSV region. In one embodiment, stress buffers surround the TSV contacts to form a TSV contact unit. In one embodiment, the stress buffers at least partially surround the TSV contacts. In other embodiments, the stress buffers completely surround the TSV contacts. The TSV contact units are separated from each other by substrate portions 430.

In one embodiment, the TSV contacts and stress buffers include the same or similar shape. Providing TSV contacts and stress buffers with different shapes may also be useful. The diameter of the TSV contacts, for example, may range from about 1 μm to 10 μm. Providing TSV contacts with other diameters, for example greater than 10 μm, may also be useful. In one embodiment, the diameter of the TSV contacts is about 5 μm. The total width of the TSV contact unit may range from 5 to 10 μm, depending on the size of the TSV contacts. Providing the TSV contact units with other sizes, such as greater than 10 μm, may also be useful. The stress buffers extend partially into the substrate to a depth D measured from the first or top surface 354. In one embodiment, the depth of the stress buffers is different than the depth of the TSV contacts. The depth of the stress buffers, in one embodiment, is less than the depth of the TSV contacts. The depth D may be about 300 nm to 30 μm. Other depths which the stress buffers extend partially into substrate may also be useful.

In one embodiment, as shown in FIG. 5a, the stress buffers extend from a first surface 354 of the dielectric layer to a depth D into the substrate. In an alternative embodiment, the stress buffers extend from the first surface 306 of the substrate to a depth D, as shown in FIG. 5b.

Figure 6A:
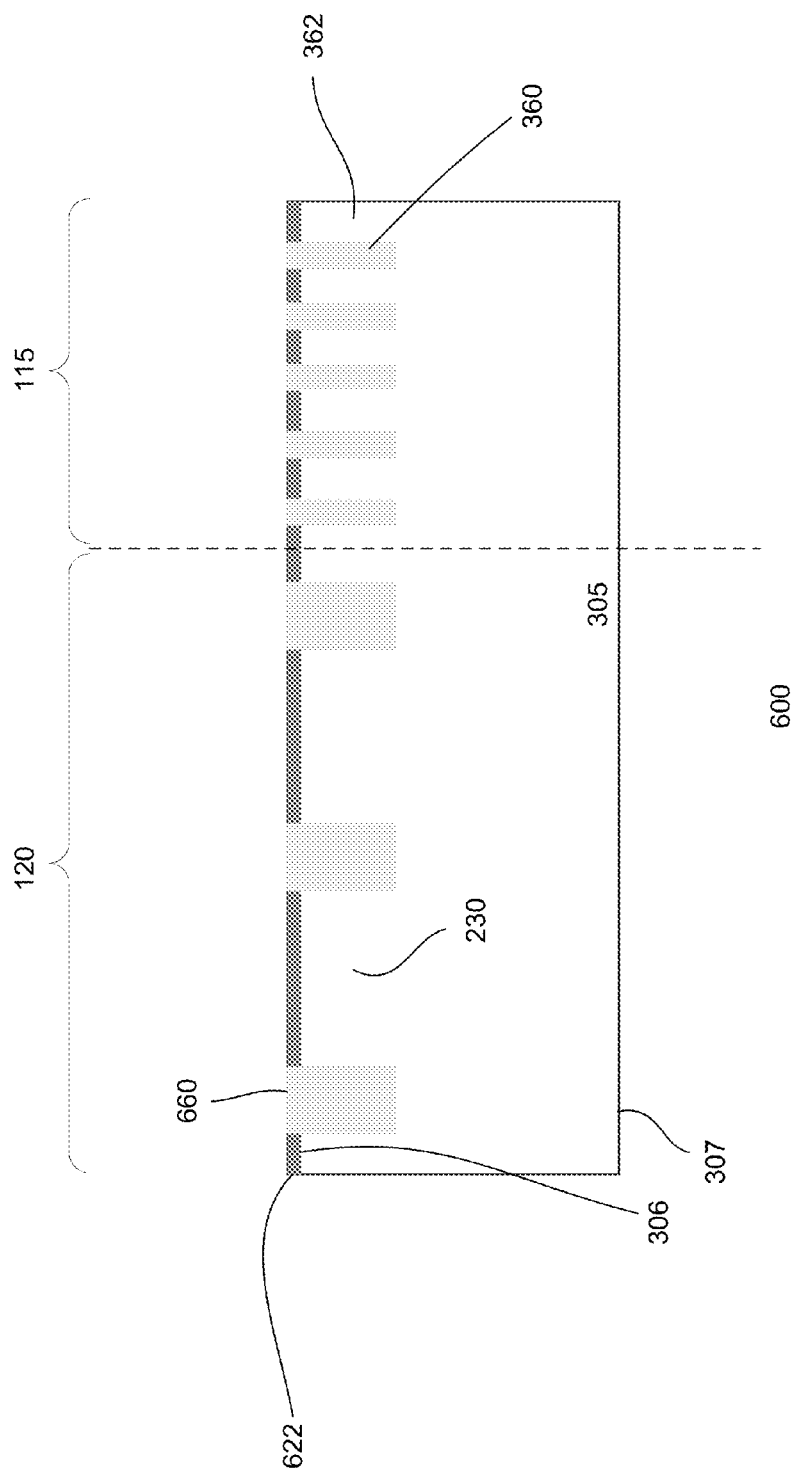

FIGS. 6a-h show cross-sectional views of an embodiment of a process 600 for forming a device. Referring to FIG. 6a, a substrate 305 is provided. The substrate includes first and second major surfaces 306 and 307. For example, the first surface may be an active surface on which device components are formed while the second surface may be an inactive surface. The first surface may be referred to as the top or front surface and the second surface may be referred to as the bottom or back surface. Other designations or uses for the surfaces may also be useful. The initial thickness of the substrate, for example, may be about 500 to 800 μm. The substrate may be processed to have a final thickness of, for example, about 5-200 μm. Providing substrates with other thicknesses may also be useful. For example, the initial and final thicknesses may vary, depending on the methodology used and the depth of the TSV contacts which are formed.

The substrate, in one embodiment, includes a semiconductor material, such as a crystalline material. For example, the substrate includes silicon. Other types of semiconductor materials, such as silicon-germanium (SiGe), germanium (Ge), gallium-arsenic (GaAs) or any other suitable materials, including subsequently developed materials, may also be used to serve as the substrate. In some embodiments, the substrate may include a crystalline on insulator (COI) type of substrate, such as silicon on insulator (SOI).

The substrate may be doped with dopants. For example, the substrate may be a lightly doped p-type (p⁻) substrate. Other types of doped substrate, including n-type (n) or having different dopant concentrations, such as heavily doped (n⁺ or p⁺) substrates or intrinsic substrates may also be useful. P-type dopants can include boron (B), aluminum (Al), indium (In) or a combination thereof, while n-type dopants can include phosphorus (P), arsenic (As), antimony (Sb) or a combination thereof. In one embodiment, the substrate is an n⁺ substrate.

In one embodiment, the substrate includes first and second regions 115 and 120. The first region includes a device region and the second region includes a TSV region. The TSV region, in one embodiment, surrounds the device region. Other configuration of the TSV and device regions may also be useful. In some embodiments, additional regions on the device may be provided. In other embodiments, TSV contacts may be provided in the device region. For example, the TSV and device regions may not be clearly delineated.

The substrate is prepared with isolation regions in the device and TSV regions. The isolation regions, for example, are shallow trench isolation (STI) regions. Other types of isolation regions may also be useful. The isolation regions 360 in the device regions, for example, isolate device active areas 362. The isolation regions 660 in the TSV region isolate TSV active areas 230. As shown, the TSV isolation regions are wider than device isolation regions.

The device region is separated from other regions by an isolation region. The isolation region surrounds the device region. The isolation region includes, for example, an STI region. Various processes can be employed to form the STI region. For example, the substrate can be etched using etch and mask techniques to form trenches which are then filled with dielectric materials. The dielectric material, for example, may include silicon oxide, such as HDP oxide, TEOS or HARP. Other types of dielectric materials may also be useful. Chemical mechanical polishing (CMP) can be performed to remove excess oxide and provide a planar top surface. Other processes or materials can also be used to form the STI. Other types of isolation regions may also be employed. The depth of the STI may be, for example, about 300 nm. The STI may also have other depths.

In one embodiment, the substrate may include an etch stop layer 622. The etch stop layer, for example, includes a material which may be selectively removed with respect to the substrate while the isolation material of the isolation regions can be removed selective to the etch stop layer. In one embodiment, the etch stop layer includes silicon nitride. Other types of etch stop materials may also be useful. In some embodiments, a pad layer may be provided below the etch stop layer to enhance adhesion with the substrate. The etch stop layer, for example, serves as a polish stop for forming the isolation regions. The top surface of the isolation regions are planar with the top surface of the etch stop layer.

A device well (not shown) may be formed in the device region. The device well, in one embodiment, includes dopants which form a doped well. The depth of the doped well, for example, may be about 400-500 nm. Providing a doped well having other depths may also be useful. The doped well may be formed by implanting appropriate dopants with the desired dose and power into the substrate. The dopant type, dose and power may depend on the type of device to be formed. The doped well may include second polarity type dopants for a first polarity type device. For example, a p-type doped well may be for a n-type transistor. On the other hand, a n-type doped well may be for a p-type transistor.

To form the doped well, a well implant mask which exposes the device region is used. The implant mask, for example, includes photoresist patterned by a lithographic mask. To improve lithographic resolution, an anti-reflective coating (ARC) may be provided below the photoresist. For example, an exposure source irradiates the photoresist through the lithographic mask with the desired pattern. After exposure, the photoresist is developed, removing unwanted portions, transferring the pattern of the mask to the photoresist. Since the device isolation region can serve as an implant mask, this allows for increased processing window for the patterning process to form the implant mask. The implant mask may be removed after the deep well is formed. Other techniques for forming the deep device well may also be useful. An anneal may be performed to diffuse the dopants, forming a doped well which extends to under the bottom of the STI.

In the case where both n-type and p-type devices are included in the device region, both p-type and n-type wells may be formed. Additionally, there may be different types of p-type and n-type wells tailored, for example, for high, medium and low voltage devices. In some embodiment, multi-wells such as double or triple wells may also be provided, depending on the type of device to be formed. Different implant processes may be employed to form the different wells. Other configurations of device wells may also be useful.

Figure 6B:
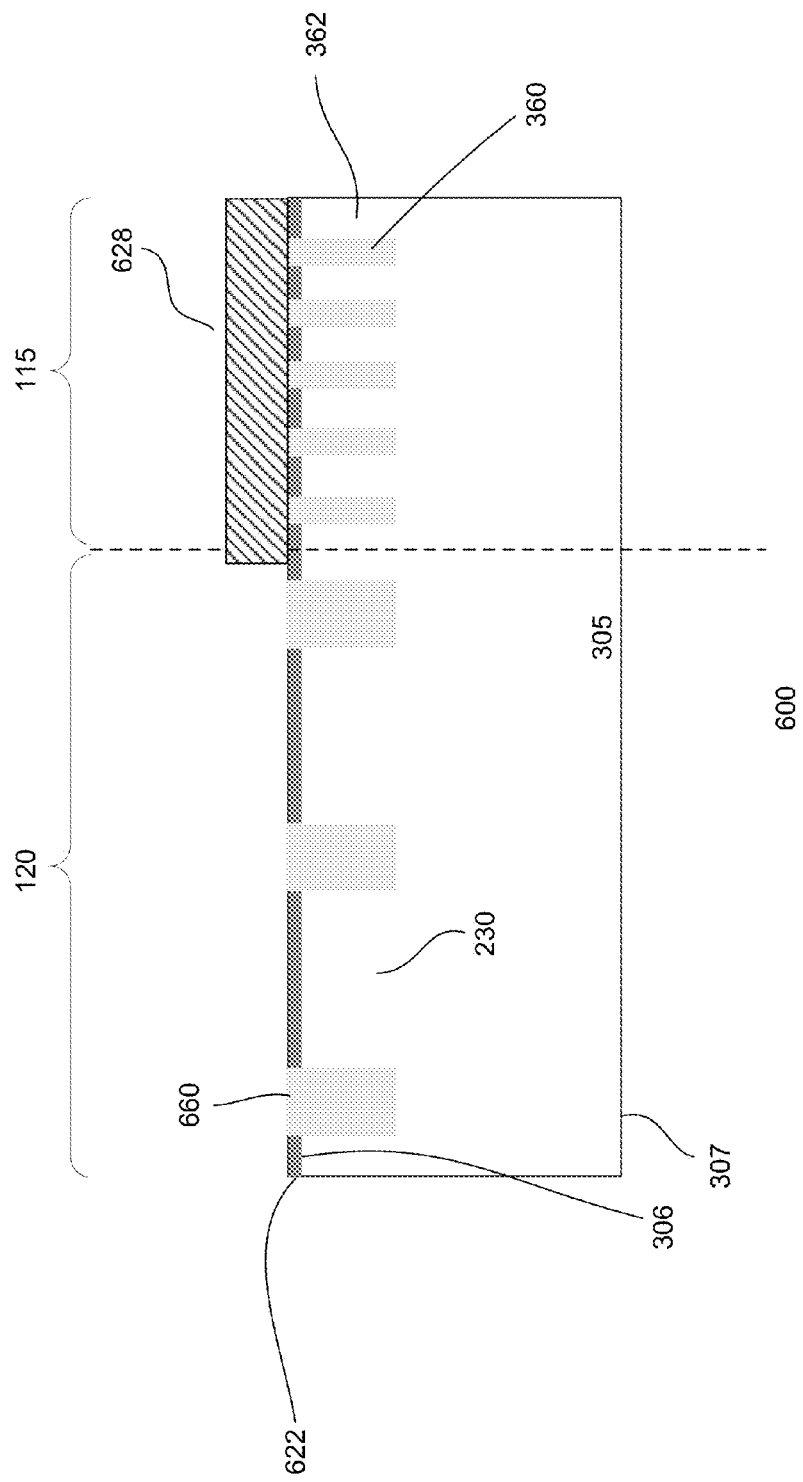

In FIG. 6b, a mask 628 is provided over the device region. The mask protects the device region while leaving the TSV region exposed. In one embodiment, the mask includes a photoresist mask. Other types of mask may also be useful. The mask should have a thickness sufficient to sustain the processing of the TSV area.

Figure 6C:
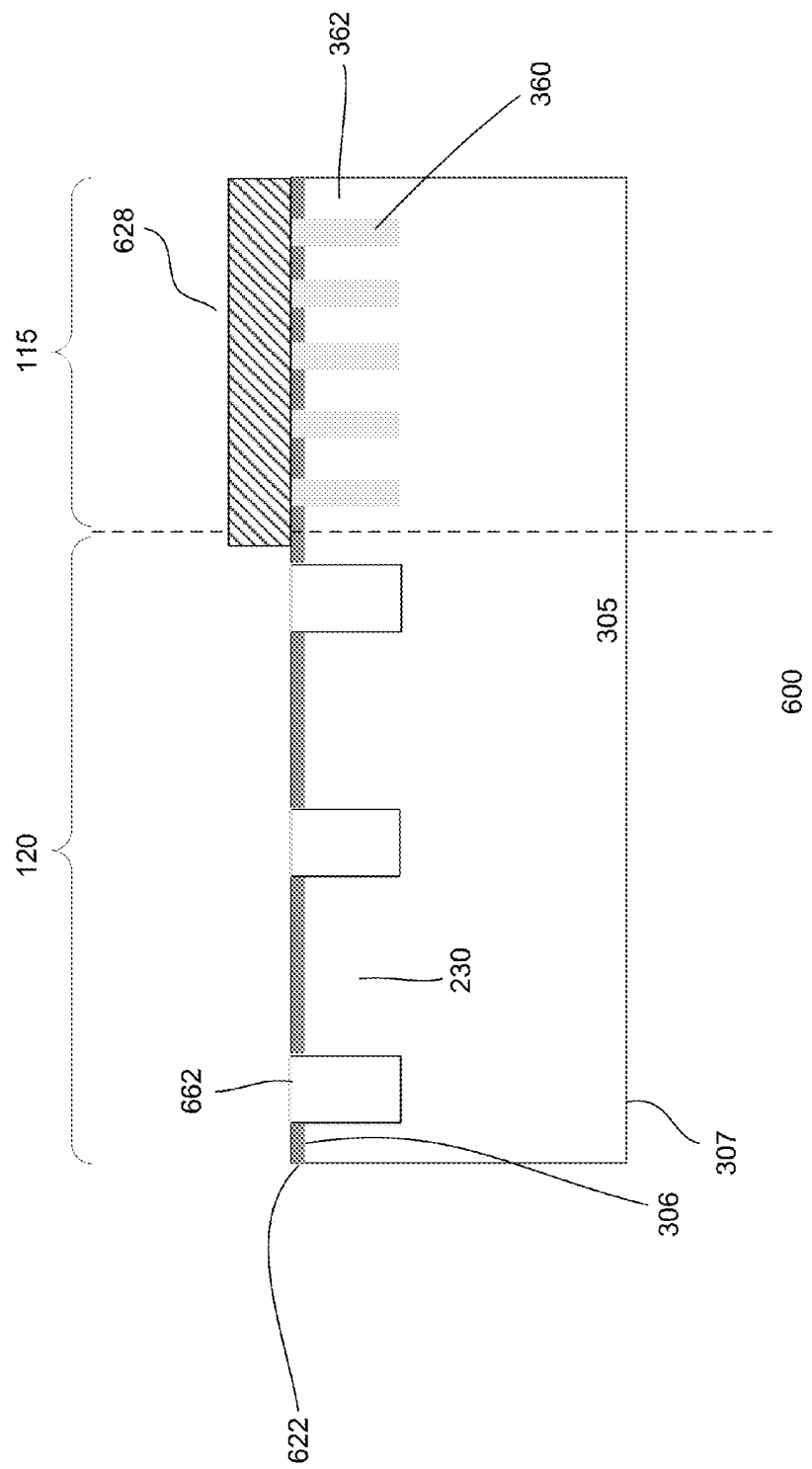

Referring to FIG. 6c, the isolation material in the isolation regions is removed. In one embodiment, an etch may be employed which removes the isolation material selective to the etch stop layer and substrate, leaving isolation trenches 662 in the TSV region. For example, a wet etch may be employed to selectively remove the isolation materials. Other types of etch, such as a dry etch, including reactive ion etch (RIE), may also be useful.

Figure 6D:
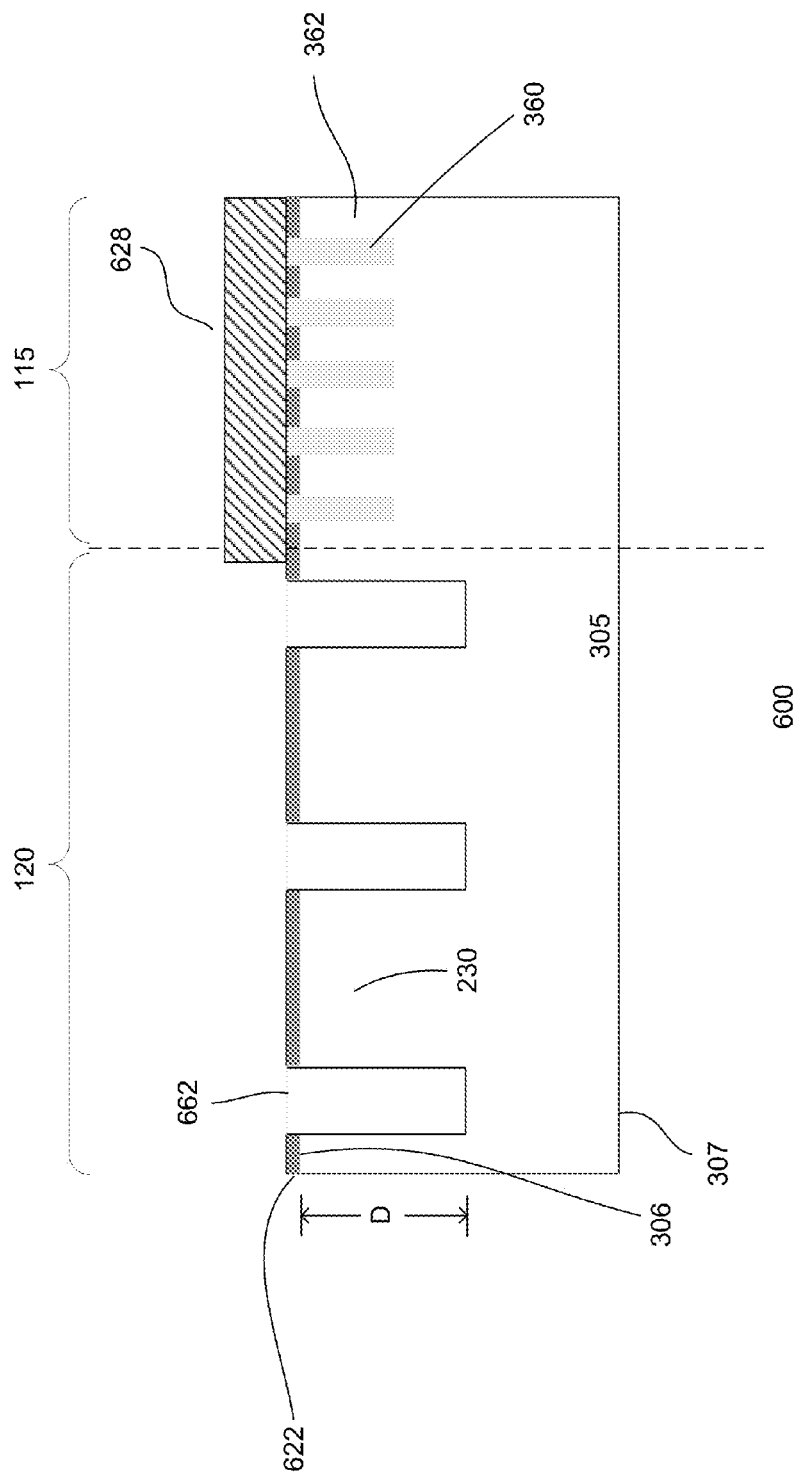

An etch may be performed to increase the depth of the isolation trenches 662 to form stress buffer trenches in the TSV regions, as shown in FIG. 6d. The etch, for example, include a RIE. The etch is selective to the etch stop layer. The depth D of the isolation trenches is increased to improve stress alleviation of the stress buffers. For example, the stress buffer trenches may have a final depth D of about 300 nm to 30 μm. Other depths for the stress buffer trenches may also be useful. In other embodiments, the etch may be eliminated in the event the depth of the isolation trenches is sufficiently deep already.

Referring to FIG. 6e, a stress buffer material 653 is deposited on the substrate, filling the stress buffer trenches. The stress buffer material should have a low elastic modulus, such as less than about 100 GPa and low hardness to absorb the thermal stress caused by CTE mismatch of the subsequently formed TSV contact and substrate materials. The stress buffer material, for example, may include polymer, plastic, organic or inorganic dielectrics, porous dielectric material such as porous glass or a combination thereof. Other types of stress buffer materials may also be useful.

In one embodiment, the stress buffer material is deposited by spin-on techniques. Spin-on techniques produce a self-planarizing layer. The stress buffer material, in one embodiment, is cured. The curing temperature, for example, is less than 500° C. In other embodiments, the stress buffer material is deposited by chemical vapor deposition (CVD). Other deposition techniques, such as sol-gel method, may also be useful.

Figure 6F:
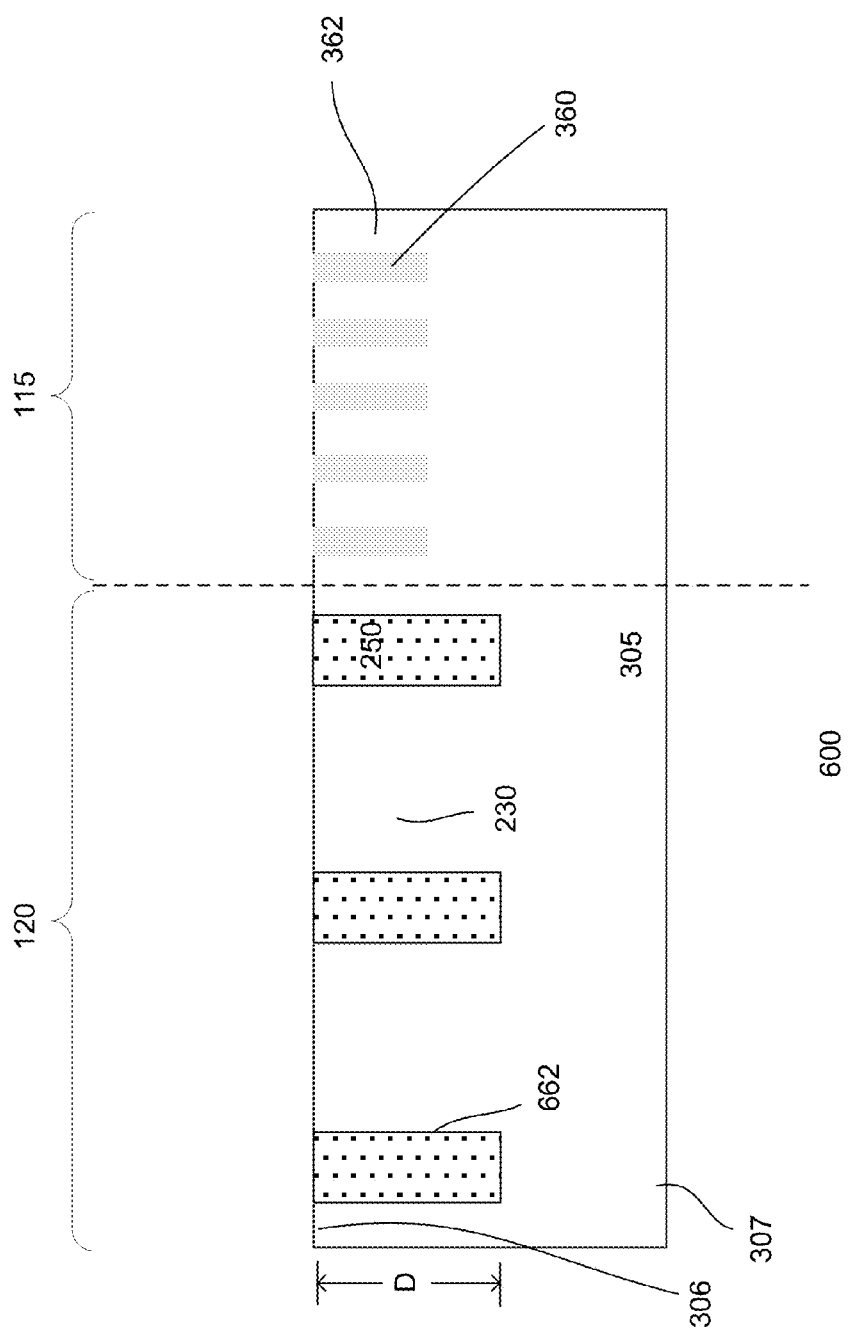

As shown in FIG. 6f, a planarization process is performed, removing excess stress buffer material and etch stop layer to expose the substrate surface. The planarization process produces a planar top surface with the substrate, stress buffers 250 and isolation regions. The planarization process, for example, includes CMP. Other type of planarization processes may also be useful. For example, the planarization process may include an etch back process. The etch back process may be a wet etch or dry etch. The etch back process, for example, may be employed to remove the excess material when the surface is flat or substantially flat. In other embodiments, a combination of CMP and etch back process may be employed. For example, a CMP is employed first to planarize the surface followed by an etch back process.

Figure 6G:
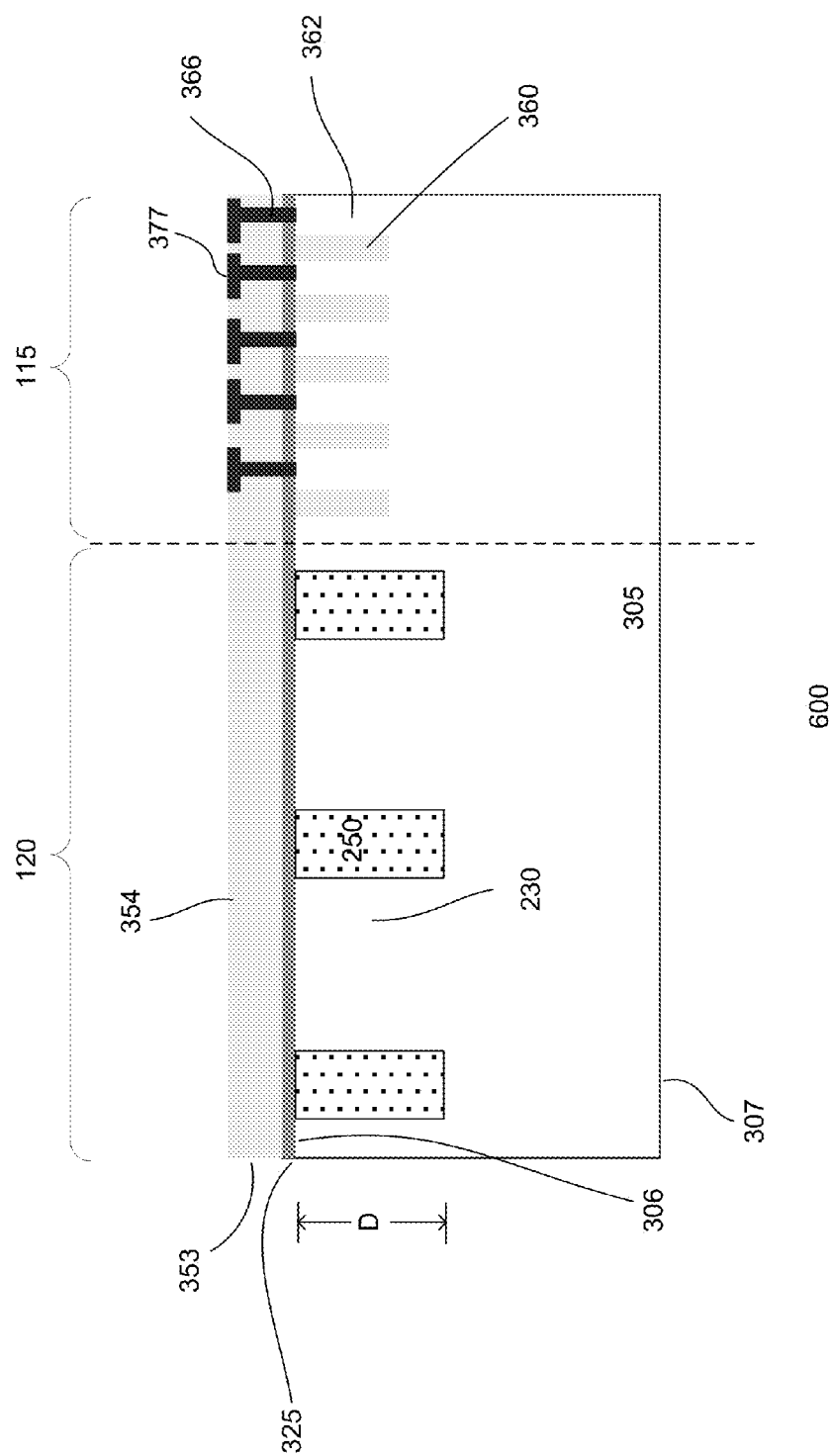

In FIG. 6g, the device region is processed. In one embodiment, the device region is processed to form components of the device. For example, the device region may be processed to form transistors. The device region may include other types of components or may be processed to form other types of components. An etch stop layer 325 may be provided over the components in the device region and TSV region.

The process continues to form an ILD layer 353 over the substrate covering the etch stop layer and components. Interconnections, including contacts 366 and interconnects or conductive lines 377 are formed in the ILD layer. Although a single ILD layer is shown, it is understood that the ILD layer may include multiple ILD layers with interconnects. The ILD layer also covers the TSV region. In one embodiment a top surface 354 of the ILD layer is coplanar with a top surface of the interconnects.

Figure 6H:
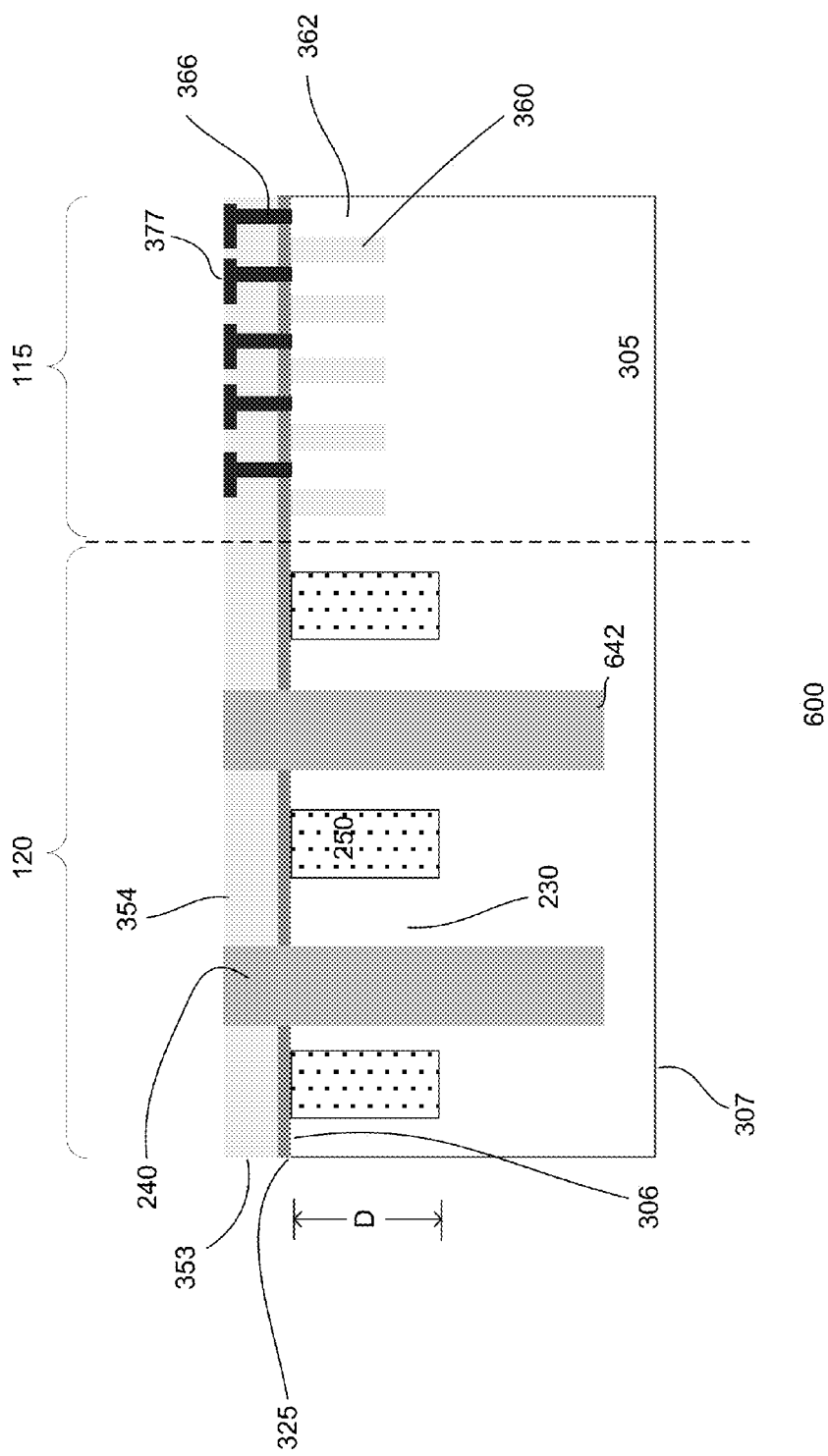

In FIG. 6h, TSV contacts 240 are formed in the TSV region between the stress buffer regions. To form the TSV contacts, a patterned mask with mask openings corresponding to location of the TSV contact vias is provided. The patterned mask, for example, may be a photoresist mask. The pattern of the mask is transferred to the ILD layer. The exposed substrate may be patterned by, for example, a deep RIE (DRIE) process using a patterned mask to form the TSV contact vias 642. In one embodiment, the TSV contact vias do not extend through the substrate. The depth of the TSV contact vias, for example, should be greater than or the same as the final thickness of the substrate. In one embodiment, the depth of the TSV contact vias is different than the depth of the stress buffers. The depth of the TSV contact vias, in one embodiment, is greater than the depth of the stress buffers. In one embodiment, the depth of the TSV contact vias is about 5 to 200 μm. Other depth dimensions for the TSV contact vias may also be useful.

The TSV contact vias are cleaned. The process may continue to form TSV contacts. In one embodiment, the process continues by forming various types of liners on the walls of the TSV vias. For example, a diffusion barrier or isolation layer may be formed on the walls of the TSV vias. The isolation layer, for example, may include a dielectric material such as $SiO_2$. Other materials, such as SiN, may also be used. The isolation layer may be formed by CVD. Other techniques for forming the isolation layer may also be useful. One or more liners may be formed over the isolation layer. For example, a liner, such as Ti, Ta, TiN, TaN, Ru, W or a combination thereof, may be formed over the isolation layer. The liner or liners may be formed by, for example, PVD or ALD. Other techniques for forming the liners may also be useful.

After the liners are formed, the vias are filled with a conductive material. The conductive material, in one embodiment, includes copper (Cu). Other types of conductive materials may also be useful. The Cu can be deposited by plating techniques, such as electro or electroless plating. Other techniques for filling the vias with conductive materials may also be useful. When plating is employed, a Cu seed layer is first formed on the walls of the TSV vias. The seed layer may be formed by, for example, PVD. Thereafter, the Cu is plated over the seed layer to fill the TSV vias. Other techniques may also be used to fill the TSV contact vias. Excess conductive material on the surface of the ILD layer is removed. For example, the excess conductive material is removed by CMP, forming a planar surface with the ILD layer, interconnects and TSV contacts.

The process continues, for example, to form the device. In one embodiment, the process continues with multi-layer metallization process such as forming M1, V1, M2, etc. over the ILD layer until the top layer of the device. The substrate is thinned to the desired thickness by removing materials from the second surface of the substrate. The substrate, for example, is thinned by grinding and the excess material of the substrate, for example, is removed by an etch. For example, a dry or wet etch may be employed to remove the excess material from the second surface of the substrate. After the substrate has been thinned to the desired thickness, the TSV contacts are exposed. The process continues by forming a conductive trace to bond the TSV contacts. The process continues to complete the formation of the device.

Figure 7A:
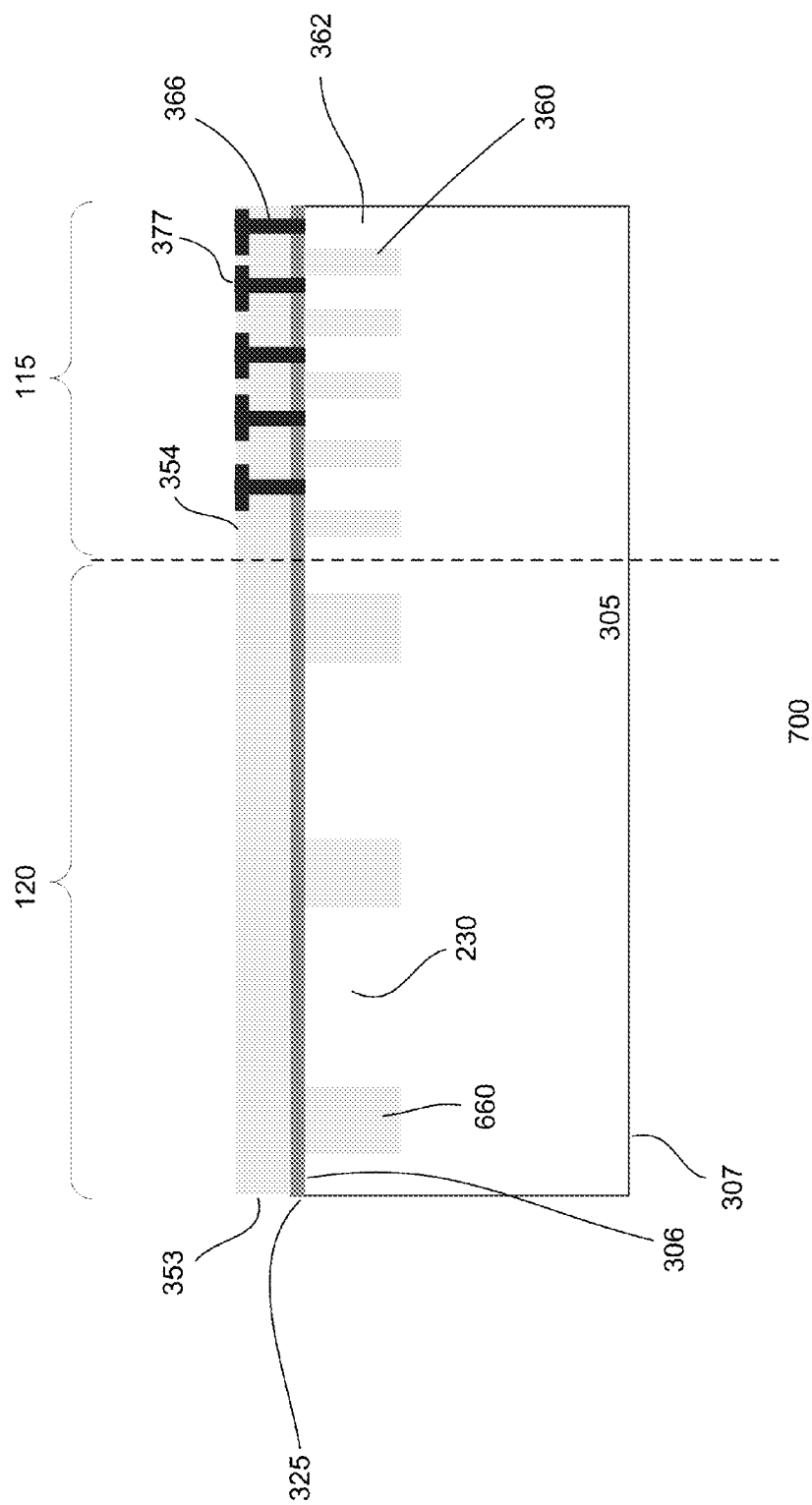
FIGS. 7a-f show another embodiment of a process for forming a device.

FIGS. 7a-f show cross-sectional views of another embodiment of a process 700 for forming a device. Referring to FIG. 7a, a substrate 305 is provided. The substrate is processed to form STI regions 360 in the device region 115 and TSV isolation regions 660 in the TSV region 120, similar to that described in FIG. 6a. The surface of the substrate is prepared with devices and an ILD layer 353 with interconnects, including contacts 366 and conductive lines 377, similar to that described in FIG. 6g. The similar components need not be described or described in detail.

Figure 7B:
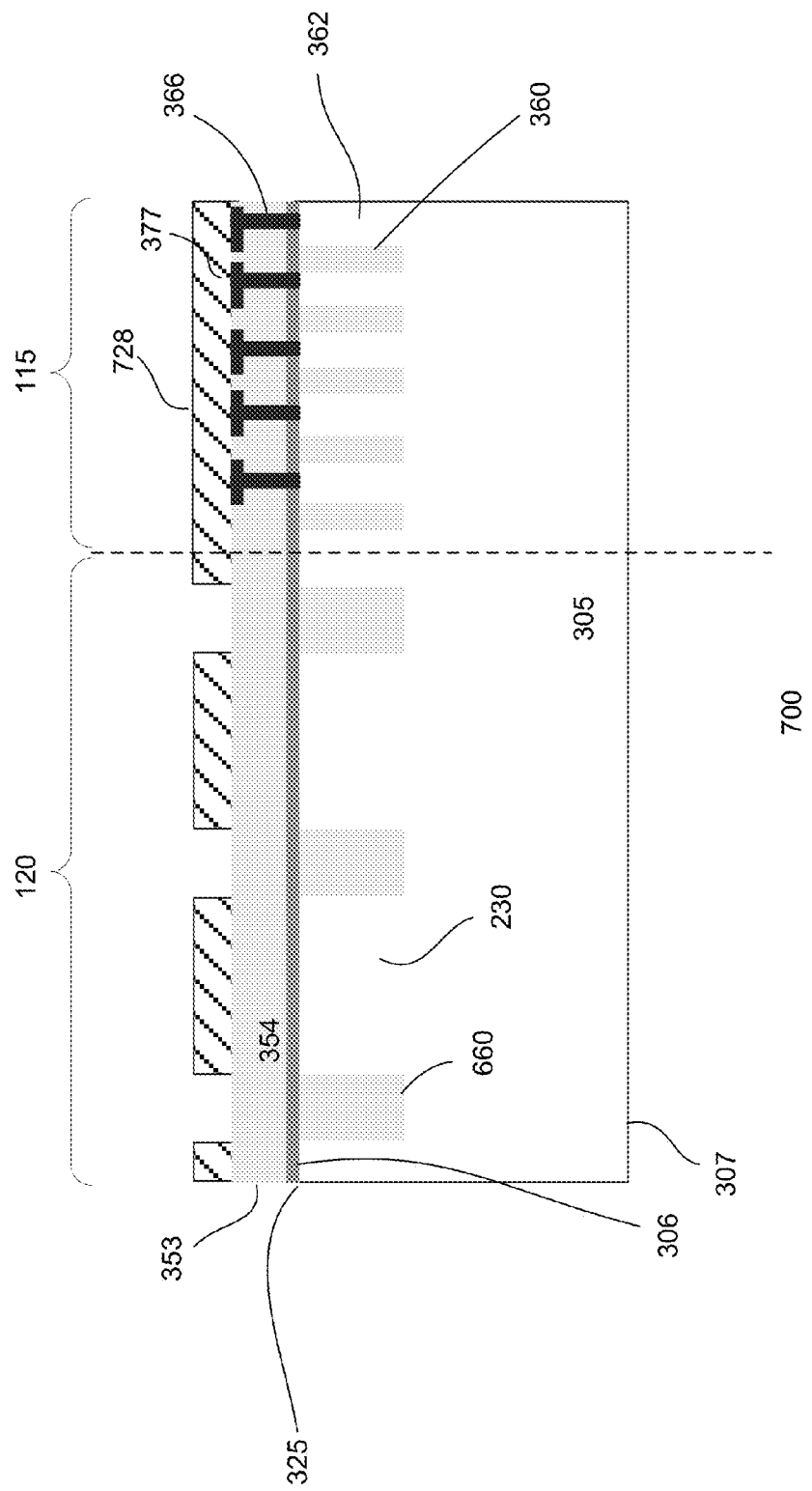

In FIG. 7b, a mask 728 is provided over the device region. The mask is patterned to protect the device region while exposing portions of the TSV region corresponding to the TSV isolation regions. In one embodiment, the mask includes a photoresist mask. Other types of mask may also be useful. The mask should have a thickness sufficient to sustain the processing of the TSV region.

Figure 7C:
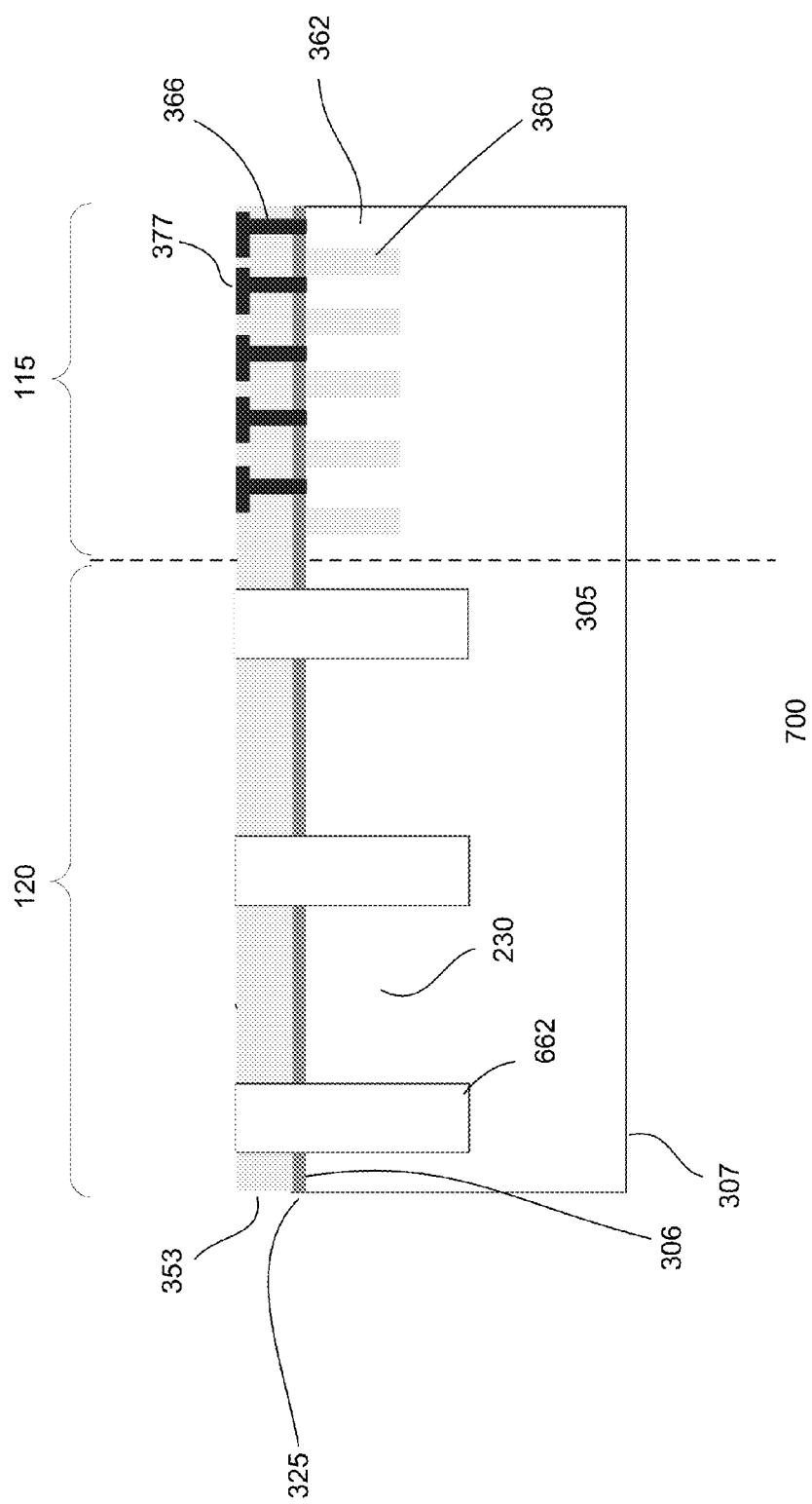

Referring to FIG. 7c, the ILD material unprotected by the mask and isolation material in the TSV isolation regions are removed. The etch may include an anisotropic etch, such as an RIE. In other embodiment, the etch may include a combination of isotropic and anisotropic etches. For example, an anisotropic etch may be used to pattern the ILD and etch stop layer unprotected by the mask. An isotropic etch, such as a wet etch, is then used to remove the isolation material in the TSV regions. Other types of etches or combination of etches may also be useful to remove the ILD, etch stop and isolation materials.

An etch may be performed to increase the depth of the isolation trenches to form stress buffer trenches 662 in the TSV regions. The etch, for example, include a RIE. The etch removes the substrate material selective to the etch stop layer. The depth D of the isolation trenches is increased to improve stress alleviation of the stress buffers. For example, the stress buffer trenches may have a final depth D of about 300 nm to 30 μm. Other depths for the stress buffer trenches may also be useful. In other embodiments, the etch may be eliminated in the event the depth of the isolation trenches is sufficiently deep already.

The mask is removed after forming the stress buffer trenches. Removal of the mask may be achieved by, for example, ashing. Other processes for removing the mask may also be useful.

Figure 7D:
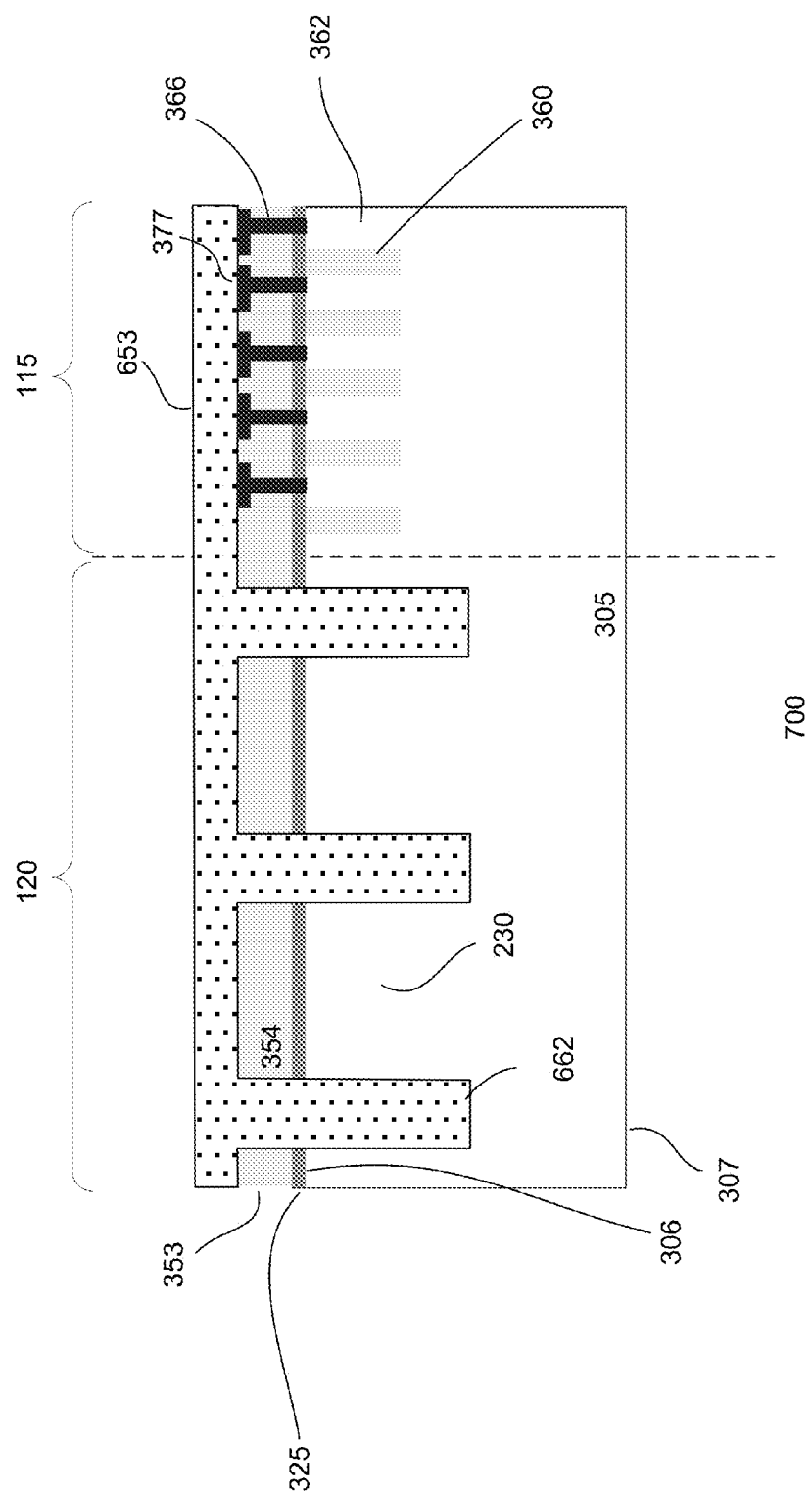

Referring to FIG. 7d, a stress buffer material 653 is deposited on the substrate, filling the stress buffer trenches. The stress buffer material should have a low elastic modulus, such as less than about 100 GPa, and low hardness to absorb the thermal stress caused by CTE mismatch of the subsequently formed TSV contact and substrate materials. The stress buffer materials, for example, may include polymer, plastic, organic or inorganic dielectrics, porous dielectric material such as porous glass or a combination thereof. Other types of stress buffer materials may also be useful.

In one embodiment, the stress buffer material is deposited by spin-on techniques. Spin-on techniques produce a self-planarizing layer. The stress buffer material is cured, for example, at a temperature less than 500° C. In other embodiments, the stress buffer material is deposited by chemical vapor deposition (CVD). Other deposition techniques, such as sol-gel method, may also be useful.

Figure 7E:
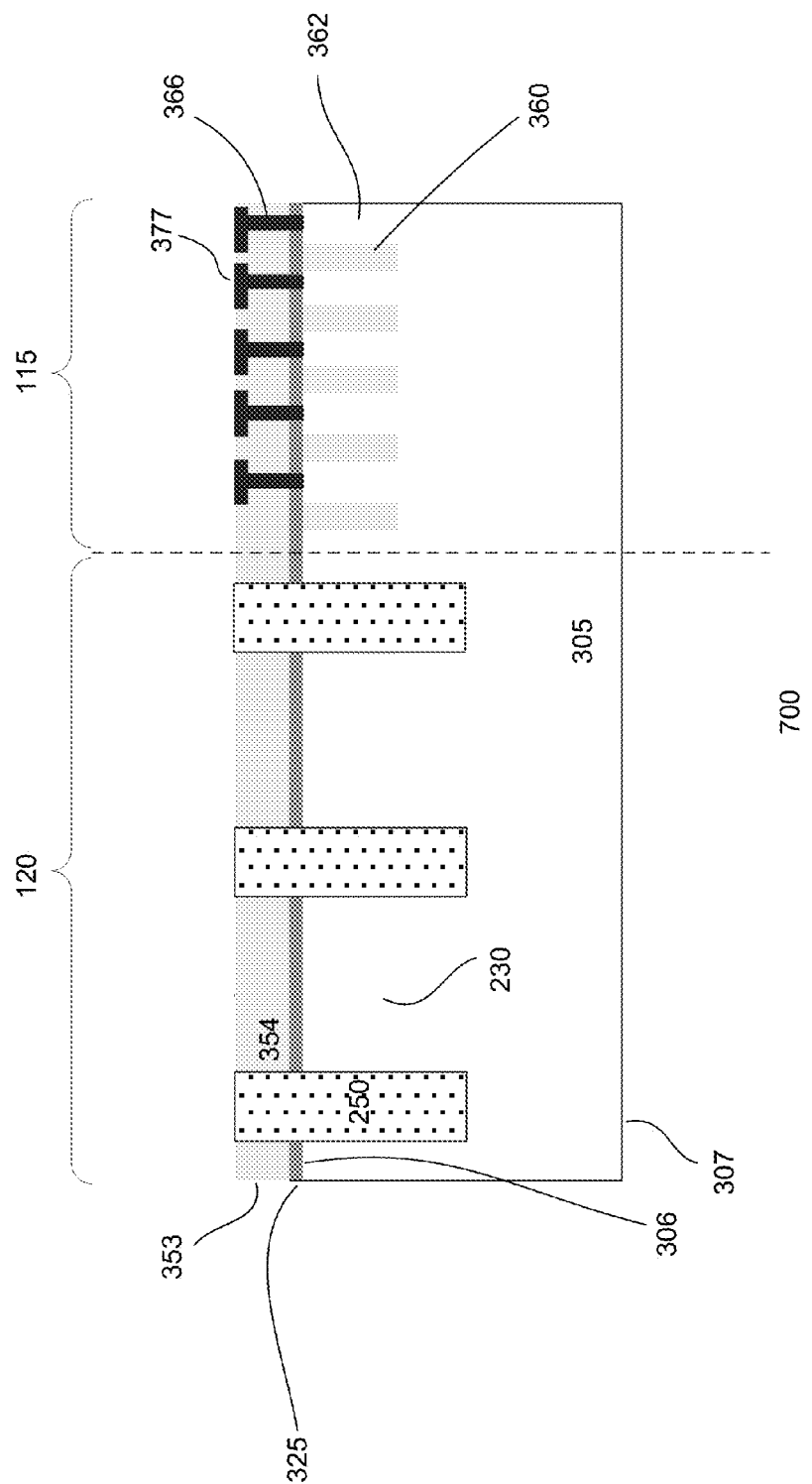

As shown in FIG. 7e, a planarization process is performed, removing excess stress buffer material to expose the top surface of the ILD layer. The planarization process produces a planar top surface with the ILD layer and stress buffers. The planarization process, for example, includes CMP. Other type of planarization processes may also be useful. For example, the planarization process may include an etch back process. The etch back process may be a wet etch or dry etch. The etch back process, for example, may be employed to remove the excess material when the surface is flat or substantially flat. In other embodiments, a combination of CMP and etch back process may be employed. For example, a CMP is employed first to planarize the surface followed by an etch back process.

Figure 7F:
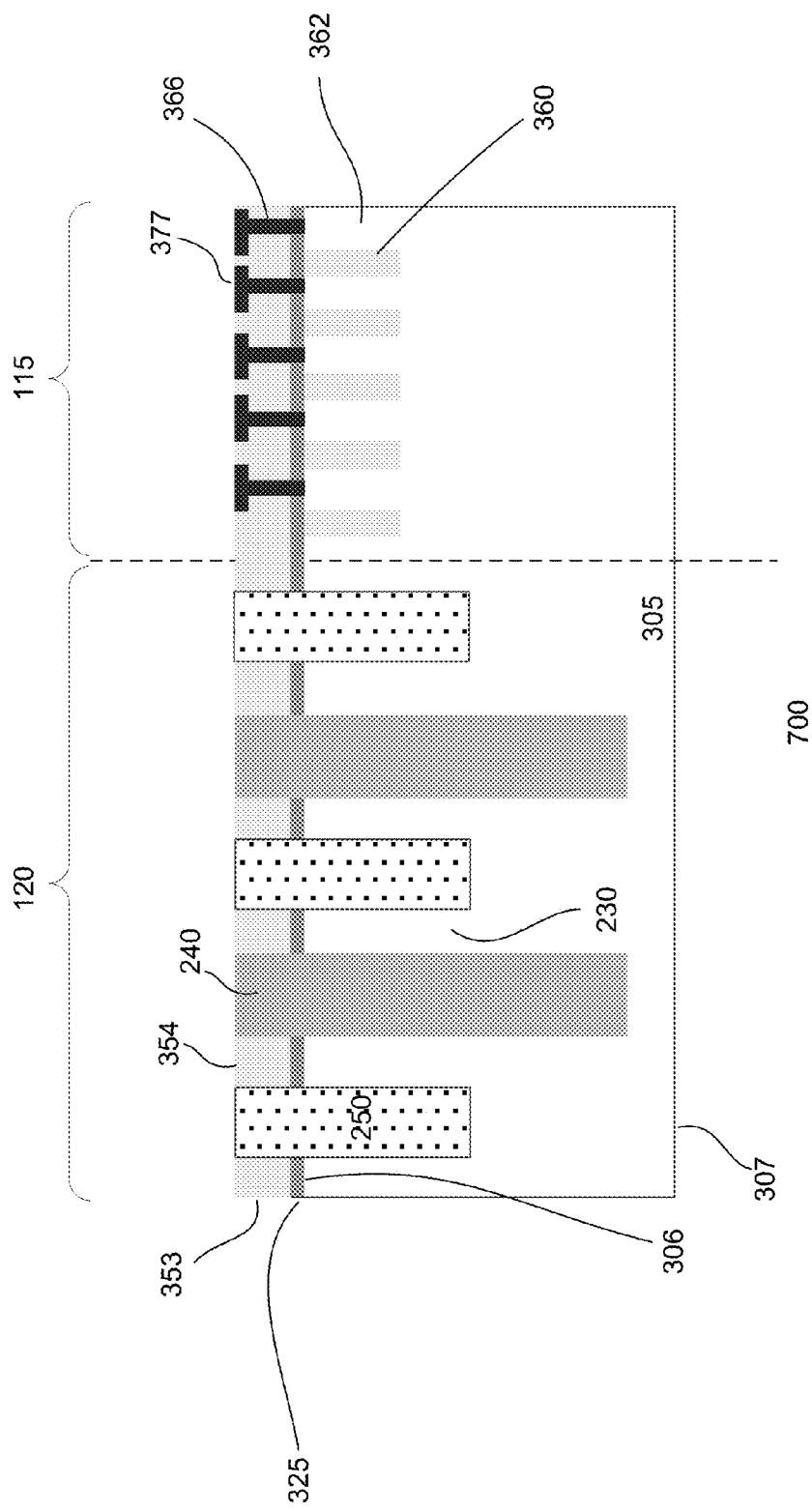

Referring to FIG. 7f, TSV contacts 240 are formed in the TSV region between the stress buffer regions. The TSV contacts may be formed by, for example, patterning the substrate to form TSV contact vias 642. The substrate may be patterned using a deep RIE (DRIE) process using a patterned mask to form the TSV contact vias. In one embodiment, the TSV contact vias do not extend through the substrate. The depth of the TSV contact vias, for example, should be greater than or the same as the final thickness of the substrate. In one embodiment, the depth of the TSV contact vias is different than the depth of the stress buffers. The depth of the TSV contact vias, in one embodiment, is greater than the depth of the stress buffers. In one embodiment, the depth of the TSV contact vias is about 5 to 200 μm. Other depths for the TSV contact vias may also be useful.

The TSV contact vias are cleaned. The process may continue to form TSV contacts. In one embodiment, the process continues by forming various types of liners on the walls of the TSV vias. For example, a diffusion barrier or isolation layer may be formed on the walls of the TSV vias. The isolation layer, for example, may include a dielectric material such as $SiO_2$. Other materials, such as SiN, may also be used. The isolation layer may be formed by CVD. Other techniques for forming the isolation layer may also be useful. One or more liners may be formed over the isolation layer. For example, a liner, such as Ti, Ta, TiN, TaN, Ru, W or a combination thereof, may be formed over the isolation layer. The liner or liners may be formed by, for example, PVD or ALD. Other techniques for forming the liners may also be useful.

After the liners are formed, the vias are filled with a conductive material. The conductive material, in one embodiment, includes copper (Cu). Other types of conductive materials may also be useful. The Cu can be deposited by plating techniques, such as electro or electroless plating. Other techniques for filling the vias with conductive materials may also be useful. When plating is employed, a Cu seed layer is first formed on the walls of the TSV vias. The seed layer may be formed by, for example, PVD. Thereafter, the Cu is plated over the seed layer to fill the TSV vias. Other techniques may also be used to fill the TSV contact vias. Excess conductive material on the surface of the ILD layer is removed. For example, the excess conductive material is removed by CMP, forming a planar surface with the ILD layer, interconnects and TSV contacts.

The process continues to form the device. In one embodiment, the process continues with multi-layer metallization process such as forming M1, V1, M2, etc., over the ILD layer until the top layer of the device. The substrate is thinned to the desired thickness by removing materials from the second surface of the substrate. The substrate, for example, is thinned by grinding and the excess material of the substrate, for example, is removed by an etch. For example, a dry or wet etch may be employed to remove the excess material from the second surface of the substrate. After the substrate has been thinned to the desired thickness, the TSV contacts are exposed. The process continues by forming a conductive trace to bond the TSV contacts. The process continues to complete the formation of the device.

Figure 8D:
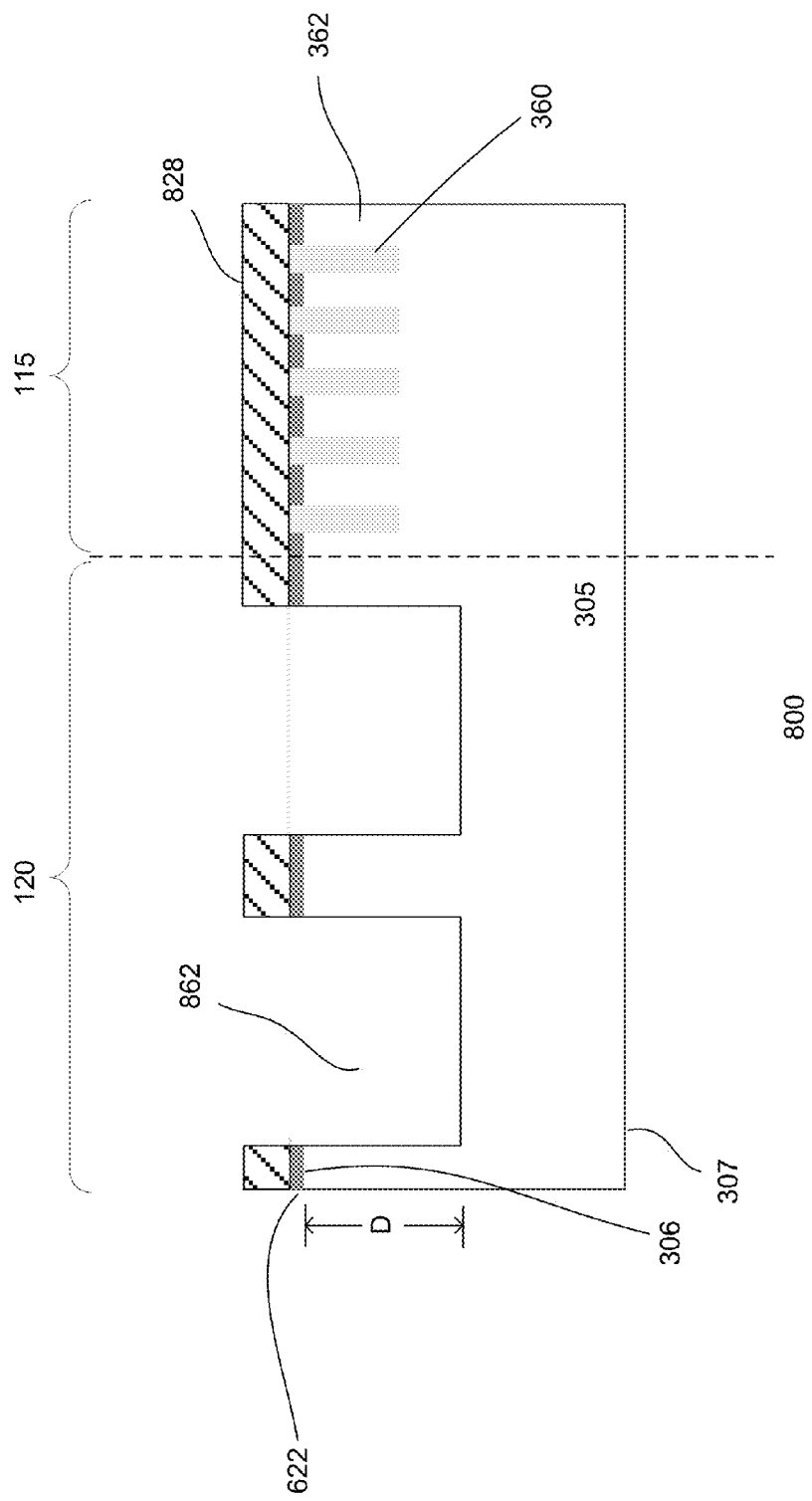

FIGS. 8*a-j* show cross-sectional views of another embodiment of a process 800 for forming a device. Referring to FIG. 8*a*, a substrate 305 is provided. The substrate is processed to form STI regions 360 in the device region 115 and TSV isolation regions 860 in the TSV region 120. The isolation regions may be processed in a similar manner to that described in FIG. 6*a*.

In one embodiment, the mask used to form the isolation regions includes both TSV isolation and device isolation regions. The data used to form the TSV isolation regions is based on the TSV contact data, except that it is expanded to allow the TSV contacts to be formed within the TSV buffer trenches. For example, the diameter of the TSV contacts may range from about 1 μm to 10 μm. Providing TSV contacts having other diameters, such as greater than 10 μm, may also be useful. In one embodiment, the diameter of the TSV contact is about 5 μm. The width of the TSV isolation region may range from 5 to 10 μm, depending on the size of the TSV contact. Providing the width of the TSV isolation region which is more than 10 μm may also be useful.

In some embodiments, the shape of the TSV isolation buffers is similar to the TSV contacts. For example, both the TSV stress buffers and TSV contacts may be circular in shape, with the TSV contacts concentrically disposed within the TSV stress buffers. Other geometric shapes, such as rectangular, may also be useful for the TSV stress buffers and contacts. This advantageously avoids the need for additional masks to form TSV stress buffers.

In other embodiments, more than one reticle, such as two reticles, may be used for forming the TSV contacts and stress buffers. In such embodiments, the TSV isolation may have a different shape than that of the TSV contacts. For example, the TSV stress buffers may be rectangular while the TSV contacts are circular. Other shapes or combination of shapes for the TSV stress buffers and TSV contacts may also be useful. The use of two reticles may also be employed to provide stress buffers and TSV contacts having the same or similar shapes.

In FIG. 8*b*, a mask 828 is provided on the substrate. The mask is patterned to at least protect the device region. In one embodiment, the mask is patterned to protect the device region and TSV region between the TSV isolation regions, thereby exposing the TSV isolation regions. In one embodiment, the mask includes a photoresist mask. Other types of mask may also be useful. The mask should have a thickness sufficient to sustain the processing of the TSV region. In alternative embodiments, the mask is pattern to protect the device region while leaving the TSV region exposed, similar to, for example, FIG. 6*d*.

Referring to FIG. 8*c*, the isolation material in the TSV isolation regions is removed. In one embodiment, an etch may be employed which removes the isolation material selective to the substrate material, leaving isolation trenches 862 in the TSV region. The etch may also be selective to the etch stop layer. For example, a wet etch may be employed to selectively remove the isolation materials. Other types of etches, such as dry etches, including reactive ion etches (RIE), may also be useful.

After the isolation material is removed from the isolation regions, an etch may be performed to increase the depth of the isolation trenches to form stress buffer trenches 862 in the TSV regions, as shown in FIG. 8*d*. The etch, for example, includes a RIE. The etch is, for example, selective to the mask and etch stop layer. The depth D of the isolation trenches is increased to improve stress alleviation of the stress buffers. For example, the stress buffer trenches may have a final depth D of about 300 nm to 30 μm. Other depths for the stress buffer trenches may also be useful. In other embodiments, the etch may be avoided in the event the depth of the isolation trenches is sufficiently deep already.

The mask is removed after forming the stress buffer trenches. Removal of the mask may be achieved by, for example, ashing. Other processes for removing the mask may also be useful. Removing the mask exposes the etch stop layer and device isolation regions.

Figure 8E:
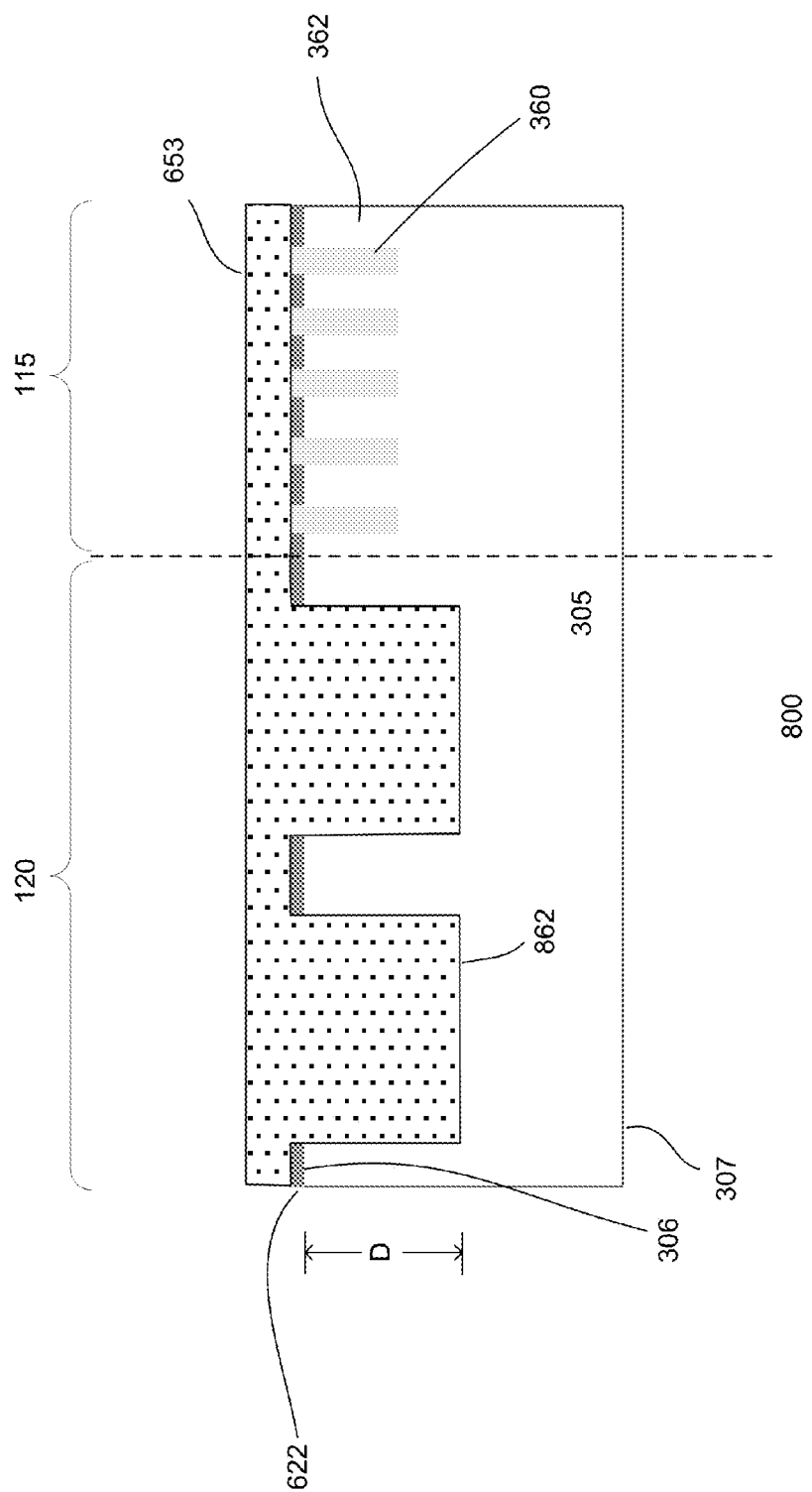

Referring to FIG. 8*e*, a stress buffer material 653 is deposited on the substrate, filling the stress buffer trenches. The stress buffer material should have a low elastic modulus, such as less than about 100 GPa, and low hardness to absorb the thermal stress caused by CTE mismatch of the subsequently formed TSV contact and substrate materials. The stress buffer materials, for example, may include polymer, plastic, organic or inorganic dielectrics, porous dielectric material such as porous glass, or a combination thereof. Other types of stress buffer materials may also be useful.

In one embodiment, the stress buffer material is deposited by spin-on techniques. Spin-on techniques produce a self-planarizing layer. The stress buffer material is cured, for example, at a temperature less than 500° C. In other embodiments, the stress buffer material is deposited by chemical vapor deposition (CVD). Other deposition techniques, such as sol-gel method, may also be useful.

As shown in FIG. 8*f*, a planarization process is performed, removing excess stress buffer material and etch stop layer to expose the substrate surface. The planarization process produces a planar top surface with the substrate, stress buffers 450 and isolation regions. The planarization process, for example, includes CMP. Other type of planarization processes may also be useful. For example, the planarization process may include an etch back process. The etch back process may be a wet etch or dry etch. The etch back process, for example, may be employed to remove the excess material when the surface is flat or substantially flat. In other embodiments, a combination of CMP and etch back process may be employed. For example, a CMP is employed first to planarize the surface followed by an etch back process.

Figure 8G:
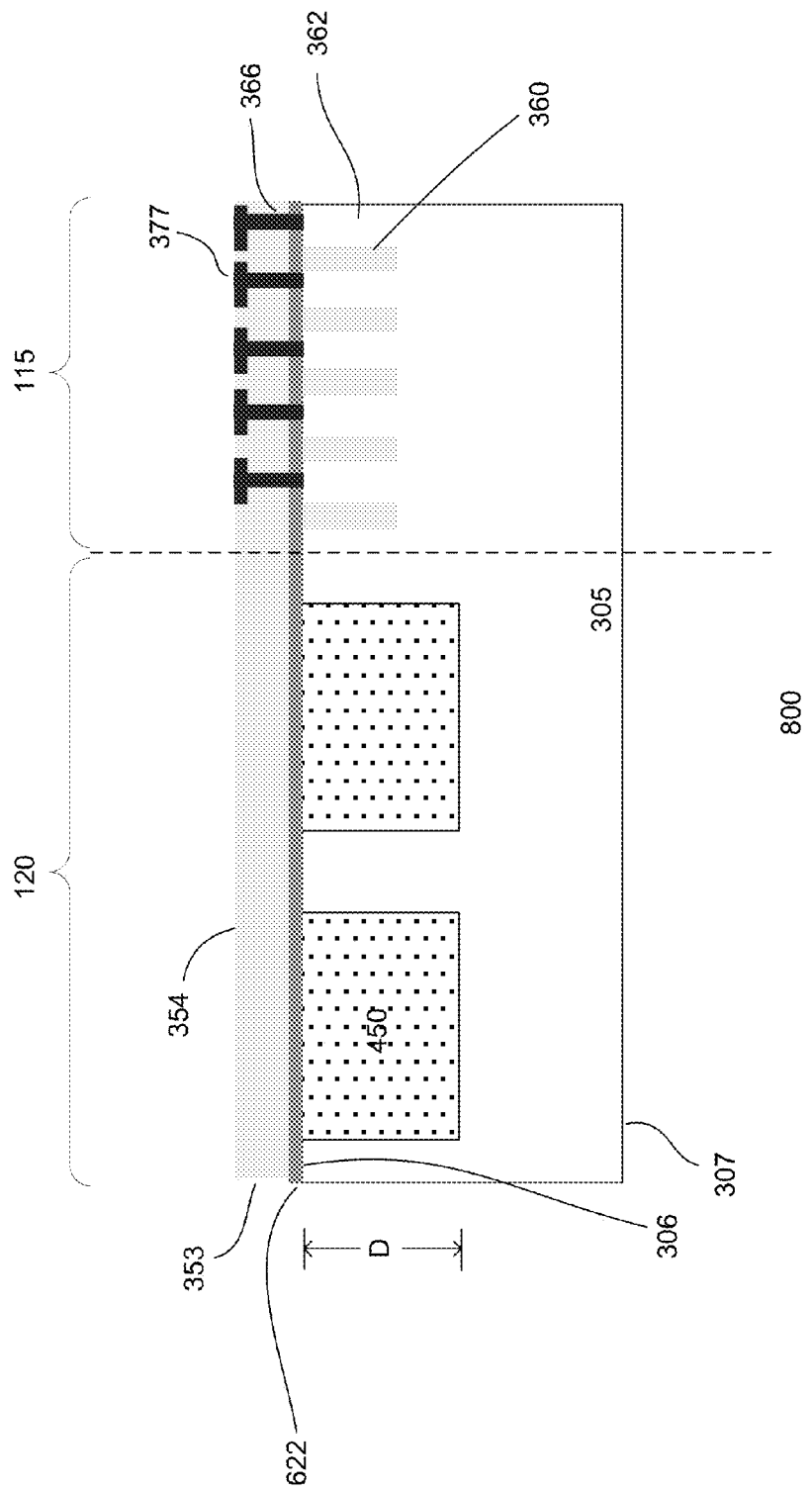

Referring to FIG. 8*g*, the device region is processed to form devices and an ILD layer 353 with interconnects, including contacts 366 and conductive lines 377. The ILD layer, for example, also covers the TSV region. The processing of the device is similar to that described in FIG. 6*g*. Similar components need not be described or described in detail.

Figure 8H:
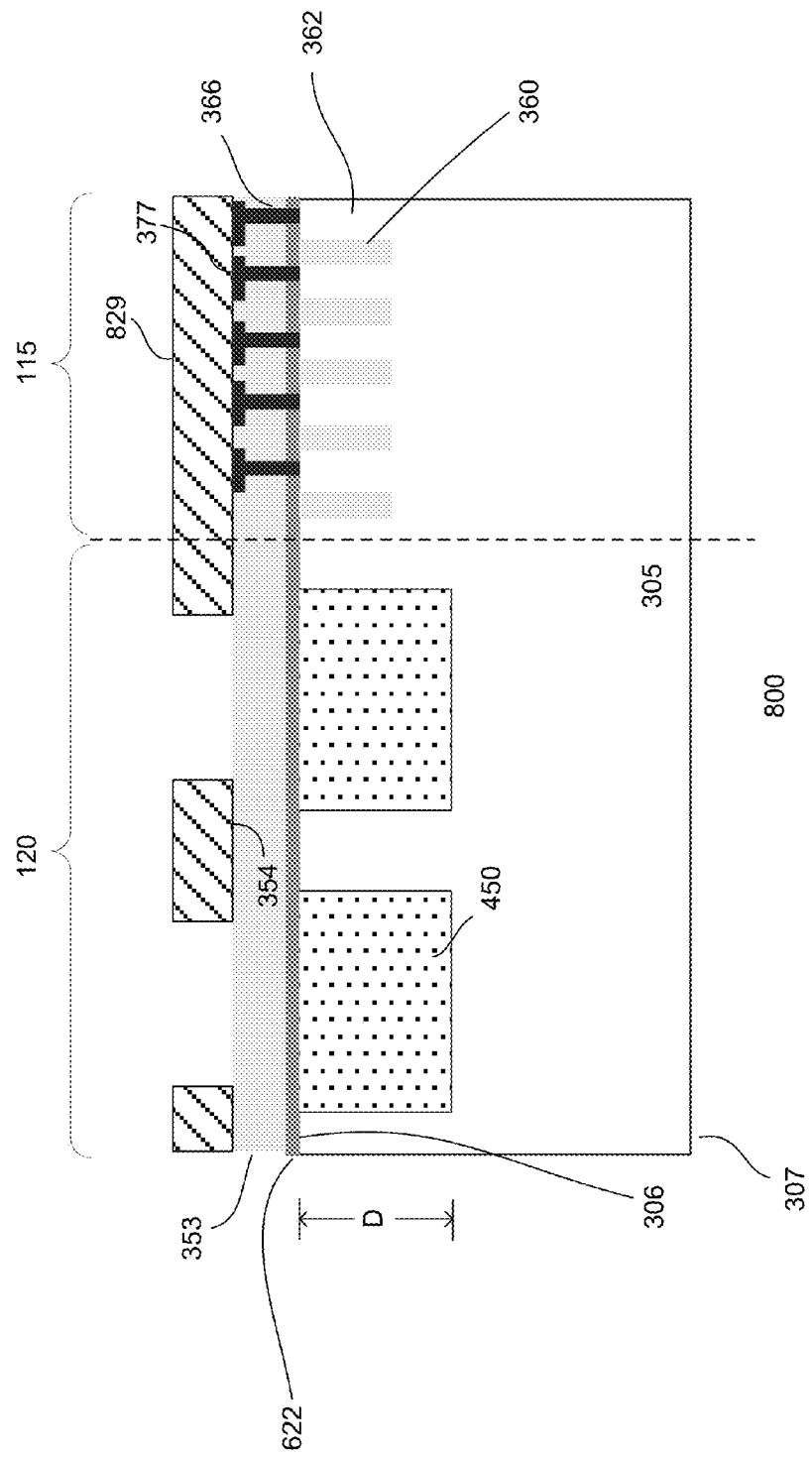

In FIG. 8*h*, a mask 829 is formed on the substrate. The mask is patterned to expose regions where TSV contact vias are to be formed. In one embodiment, the mask is patterned using the TSV contact mask, except that it is printed with a smaller or smallest CD. Printing with a smaller CD ensures that the openings in the mask for the TSV vias are within the TSV stress buffers.

Figure 8I:
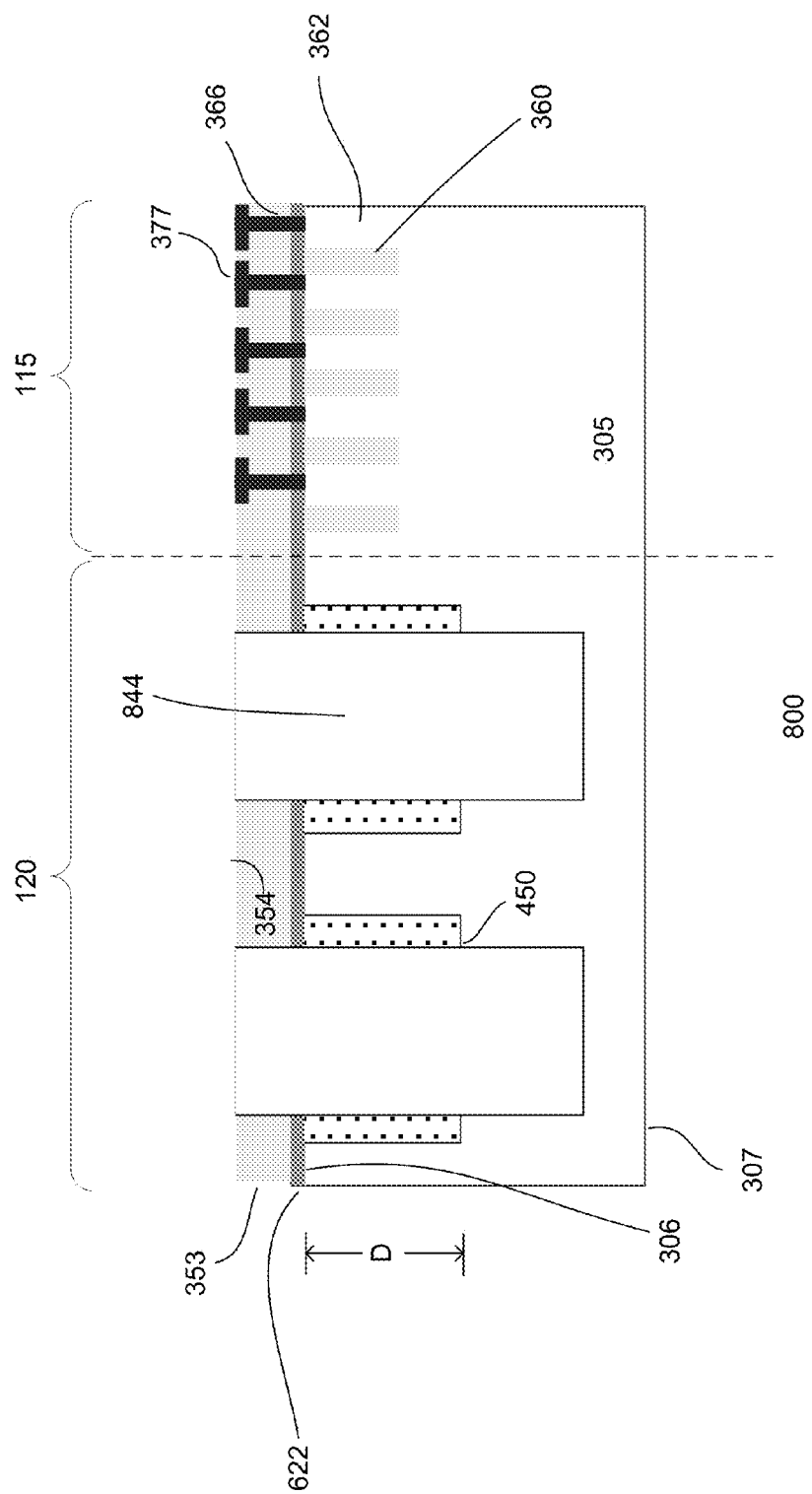
Figure 8J:
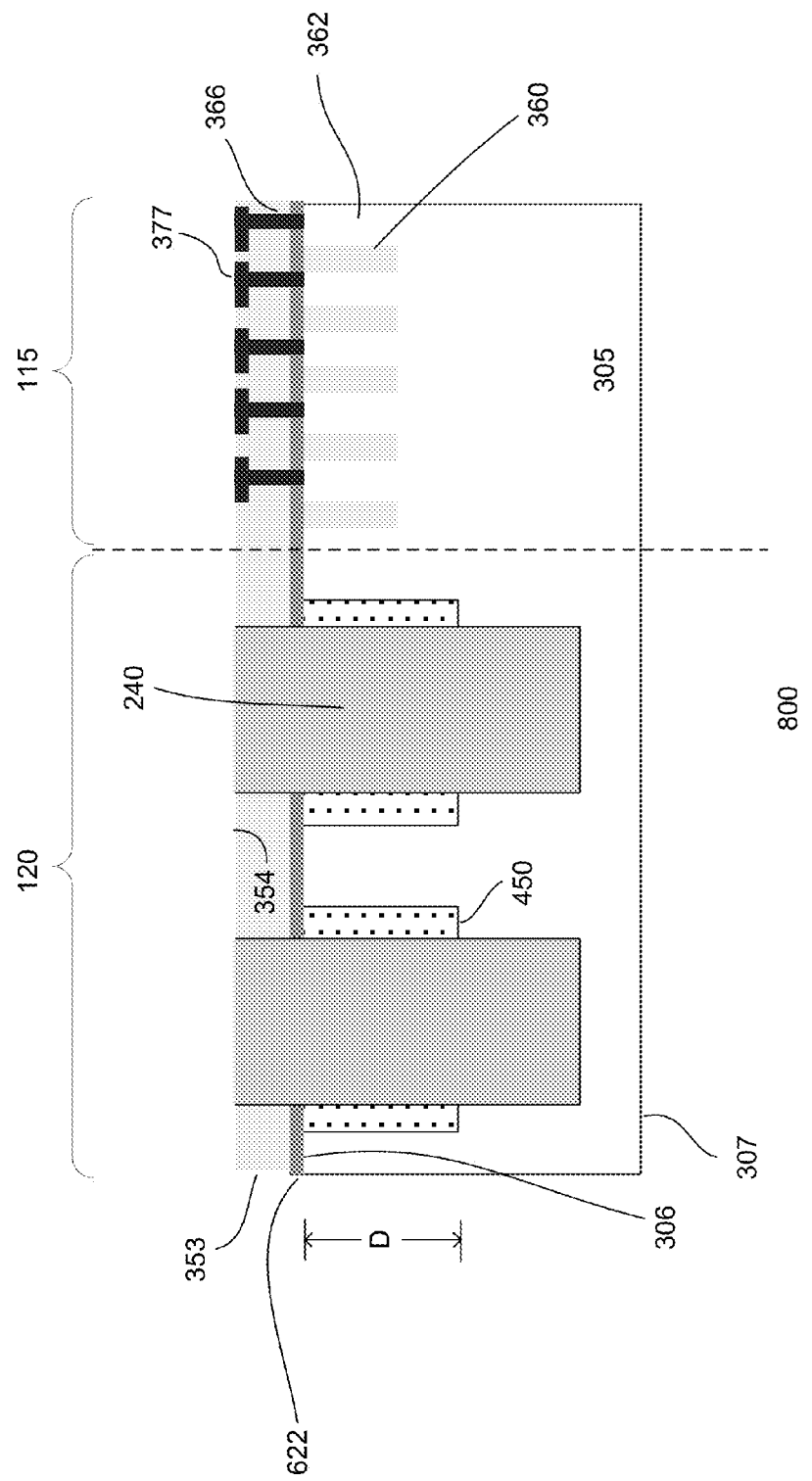

Referring to FIG. 8*i*, TSV contact vias 844 are formed in the TSV region unprotected by the mask openings. The exposed portions of the TSV region may be patterned by, for example, a deep RIE (DRIE) process using the patterned mask to form the TSV contact vias 844. In one embodiment, the TSV contact vias do not extend through the substrate. The depth the TSV contact vias, for example, should be greater than or the same as the final thickness of the substrate. In one embodiment, the depth of the TSV contact vias is different than the depth of the stress buffers. The depth of the TSV contact vias, in one embodiment, is greater than the depth of the stress buffers. In one embodiment, the depth of the TSV contact vias is about 5 to 200 µm. Other depth dimensions for the TSV contact vias may also be useful.

The TSV contact vias are cleaned. The process may continue to form TSV contacts. In one embodiment, the process continues by forming various types of liners on the walls of the TSV vias. For example, a diffusion barrier or isolation layer may be formed on the walls of the TSV vias. The isolation layer, for example, may include a dielectric material such as $SiO_2$. Other materials, such as SiN, may also be used. The isolation layer may be formed by CVD. Other techniques for forming the isolation layer may also be useful. One or more liners may be formed over the isolation layer. For example, a liner, such as Ti, Ta, TiN, TaN, Ru, W or a combination thereof, may be formed over the isolation layer. The liner or liners may be formed by, for example, PVD or ALD. Other techniques for forming the liners may also be useful.

After the liners are formed, the vias are filled with a conductive material. The conductive material, in one embodiment, includes copper (Cu). Other types of conductive materials may also be useful. The Cu can be deposited by plating techniques, such as electro or electroless plating. Other techniques for filling the vias with conductive materials may also be useful. When plating is employed, a Cu seed layer is first formed on the walls of the TSV vias. The seed layer may be formed by, for example, PVD. Thereafter, the Cu is plated over the seed layer to fill the TSV vias. Other techniques may also be used to fill the TSV contact vias. Excess conductive material on the surface of the ILD layer is removed. For example, the excess conductive material is removed by CMP, forming a planar surface with the ILD layer, interconnects and TSV contacts.

The process continues to form the device. In one embodiment, the process continues with multi-layer metallization process such as forming M1, V1, M2, etc., over the ILD layer until the top layer of the device. The substrate is thinned to the desired thickness by removing materials from the second surface of the substrate. The substrate, for example, is thinned by grinding and the excess material of the substrate, for example, is removed by an etch. For example, a dry or wet etch may be employed to remove the excess material from the second surface of the substrate. After the substrate has been thinned to the desired thickness, the TSV contacts are exposed. The process continues by forming a conductive trace to bond the TSV contacts. The process continues to complete the formation of the device.

Figure 9A:
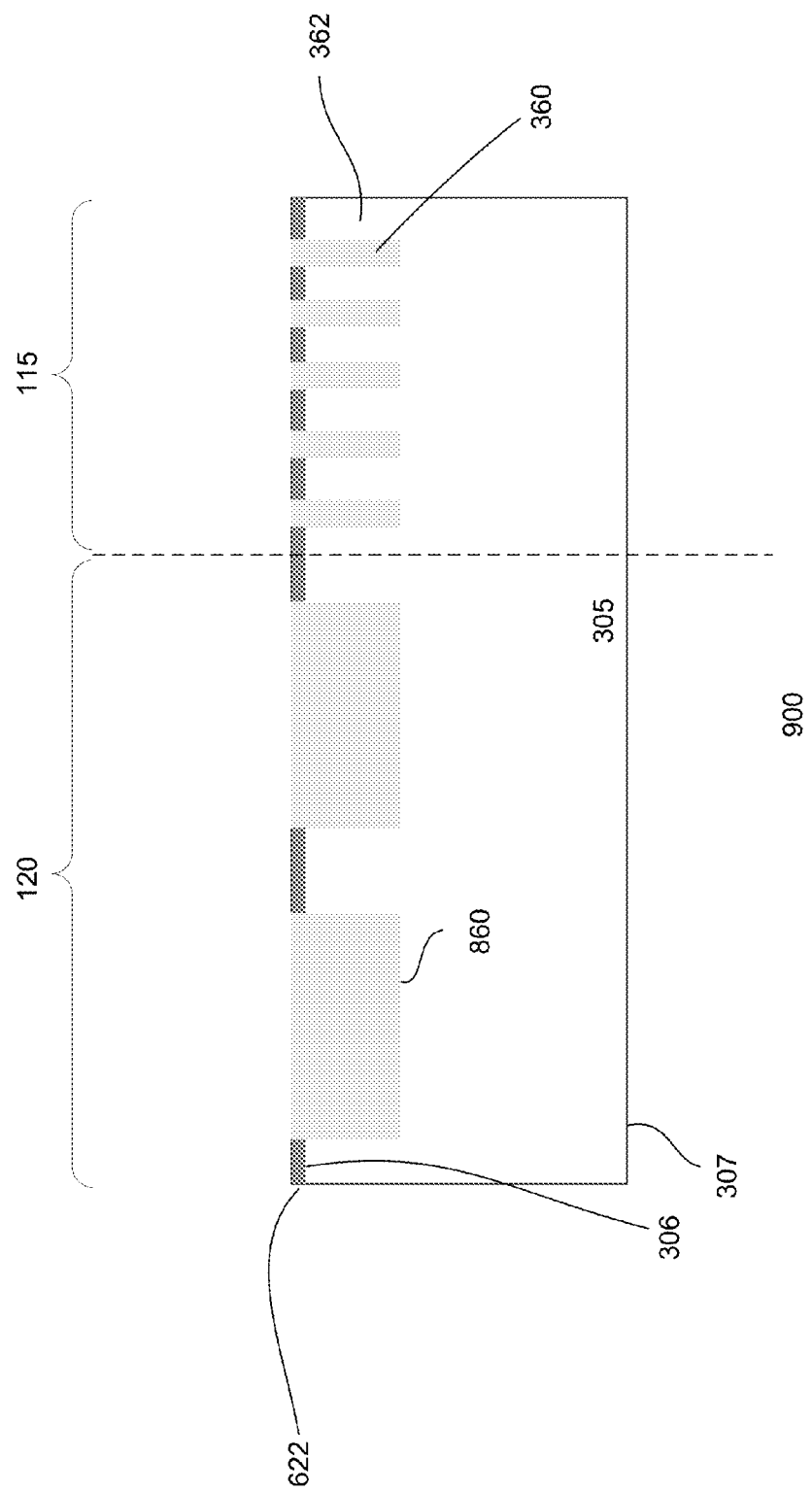
Figure 9B:
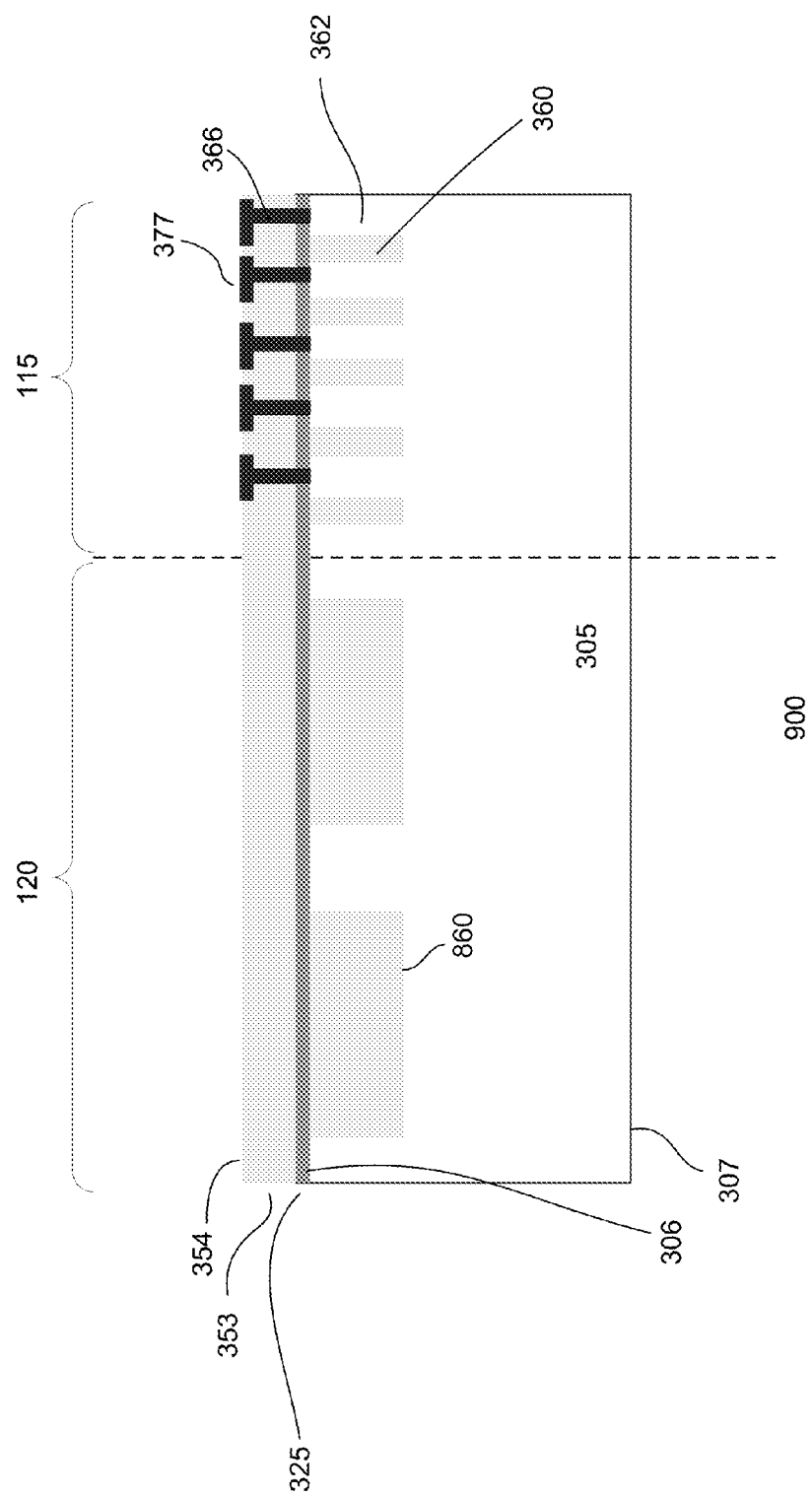

FIGS. 9a-i show cross-sectional views of another embodiment of a process 900 for forming a device. Referring to FIG. 9a, a substrate 305 is provided. The substrate is processed to form STI regions 360 in the device region 115 and TSV isolation regions 860 in the TSV region 120, similar to that described in FIG. 8a. The device region is processed to form devices and an ILD layer 353 with interconnects, including contacts 366 and conductive lines 377 in FIG. 9b. The ILD layer, for example, also covers the TSV region. Processing of the device region is similar to that described in FIG. 6g. Similar components need not be described or described in detail.

In FIG. 9c, a mask 928 is provided on the substrate. For example, the mask is provided on the ILD layer. The mask is patterned to at least protect the device region. In one embodiment, the mask is patterned to protect the device region and TSV region between the TSV isolation regions, thereby exposing the TSV isolation regions. In one embodiment, the mask includes a photoresist mask. Other types of mask may also be useful. The mask should have a thickness sufficient to sustain the processing of the TSV region. In alternative embodiments, the mask is pattern to protect the device region while leaving the TSV region exposed, similar to, for example, FIG. 6d.

Figure 9D:
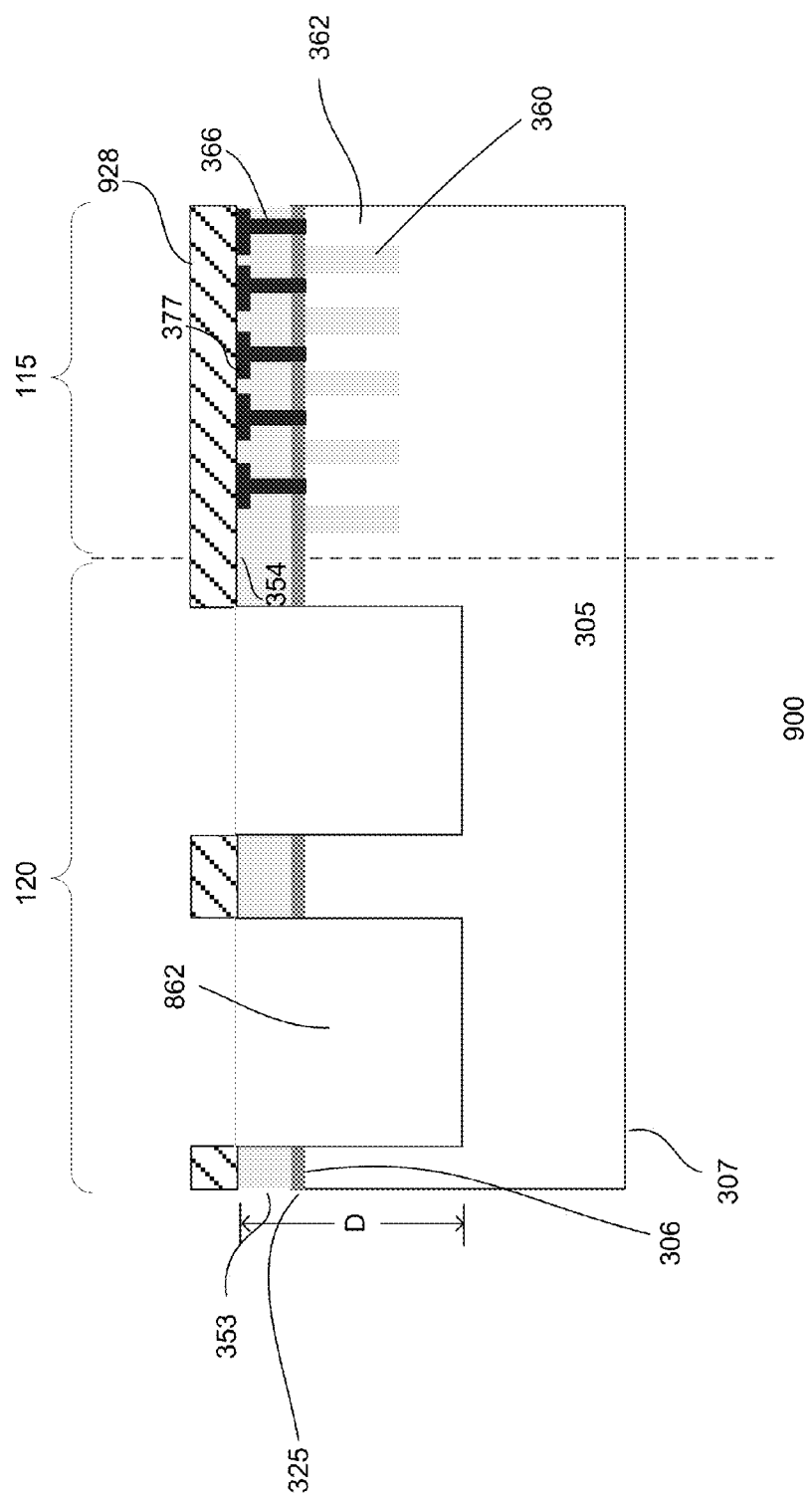

Referring to FIG. 9d, the ILD layer is patterned using the patterned mask to expose the TSV isolation regions. An etch is used to pattern the ILD layer to expose the TSV isolation regions. The etch to pattern the ILD layer, for example, includes a RIE. Other types of etch processes may also be useful. The isolation material in the TSV isolation regions is removed. In one embodiment, an etch may be employed which removes the isolation material selective to the substrate material, leaving isolation trenches 862 in the TSV region. The etch which removes the isolation material may also be selective to the etch stop layer. For example, a wet etch may be employed to selectively remove the isolation materials. Other types of etch, such as a dry etch, including reactive ion etch (RIE), may also be useful.

After the isolation material is removed from the isolation regions, an etch may be performed to increase the depth of the isolation trenches to form stress buffer trenches 862 in the TSV regions. The etch, for example, includes a RIE. The etch is, for example, is selective to the mask and etch stop layer. The depth D of the isolation trenches is increased to improve stress alleviation of the stress buffers. For example, the stress buffer trenches may have a final depth D of about 300 nm to 30 µm. Other depths for the stress buffer trenches may also be useful. In other embodiments, the etch may be eliminated in the event the depth of the isolation trenches is sufficiently deep already.

The mask is removed after forming the stress buffer trenches. Removal of the mask may be achieved by, for example, ashing. Other processes for removing the mask may also be useful. Removing the mask exposes the etch stop layer and device isolation regions.

Figure 9E:
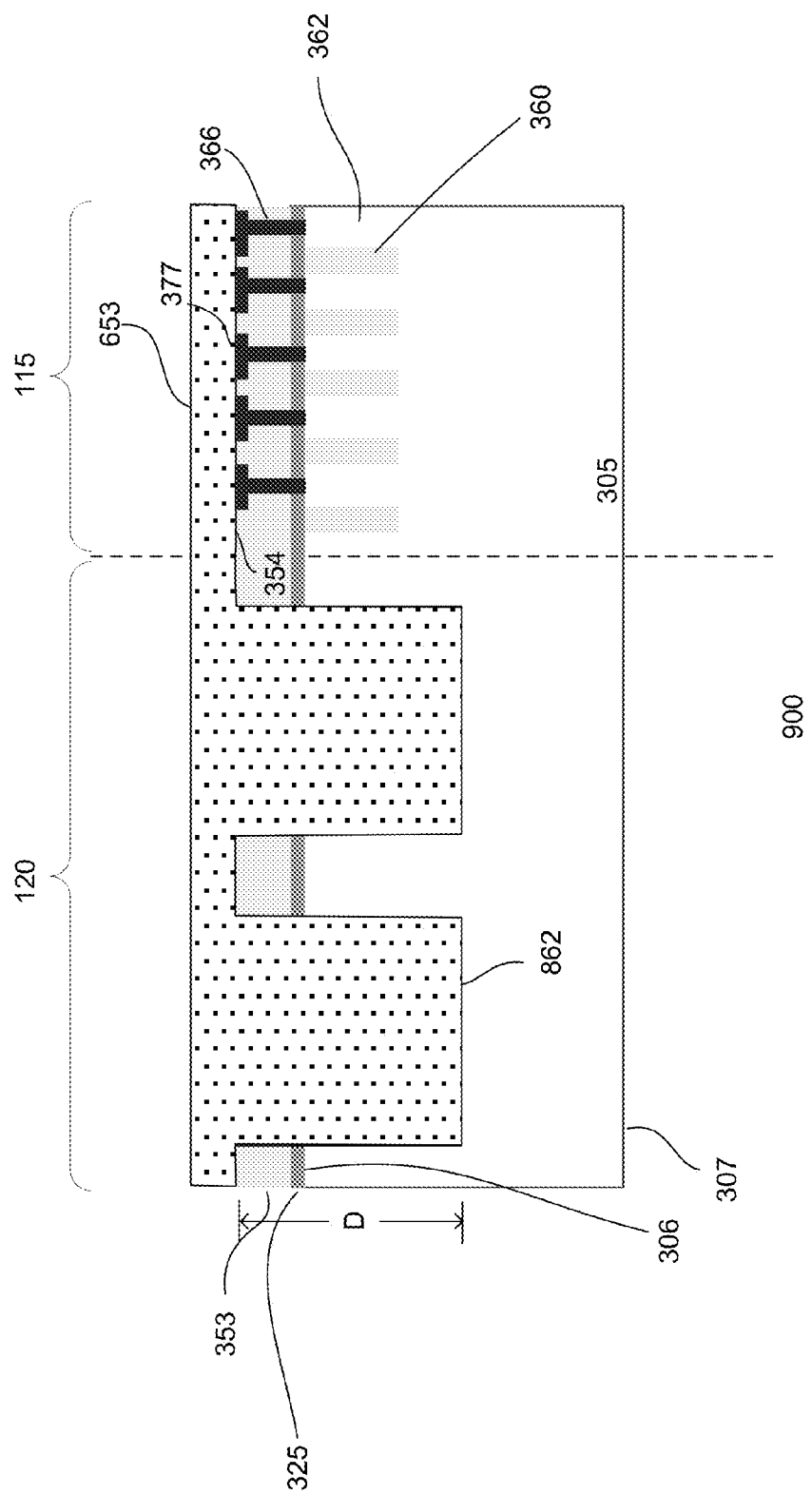

Referring to FIG. 9e, a stress buffer material 653 is deposited on the substrate, filling the stress buffer trenches. The stress buffer material should have a low elastic modulus, such as less than about 100 GPa, and low hardness to absorb the thermal stress caused by CTE mismatch of the subsequently formed TSV contact and substrate materials. The stress buffer materials, for example, may include polymer, plastic, organic or inorganic dielectrics, porous dielectric material such as porous glass, or a combination thereof. Other types of stress buffer materials may also be useful.

In one embodiment, the stress buffer material is deposited by spin-on techniques. Spin-on techniques produce a self-planarizing layer. The stress buffer material is cured, for example, at a temperature less than 500° C. In other embodiments, the stress buffer material is deposited by chemical vapor deposition (CVD). Other deposition techniques, such as sol-gel method, may also be useful.

Figure 9F:
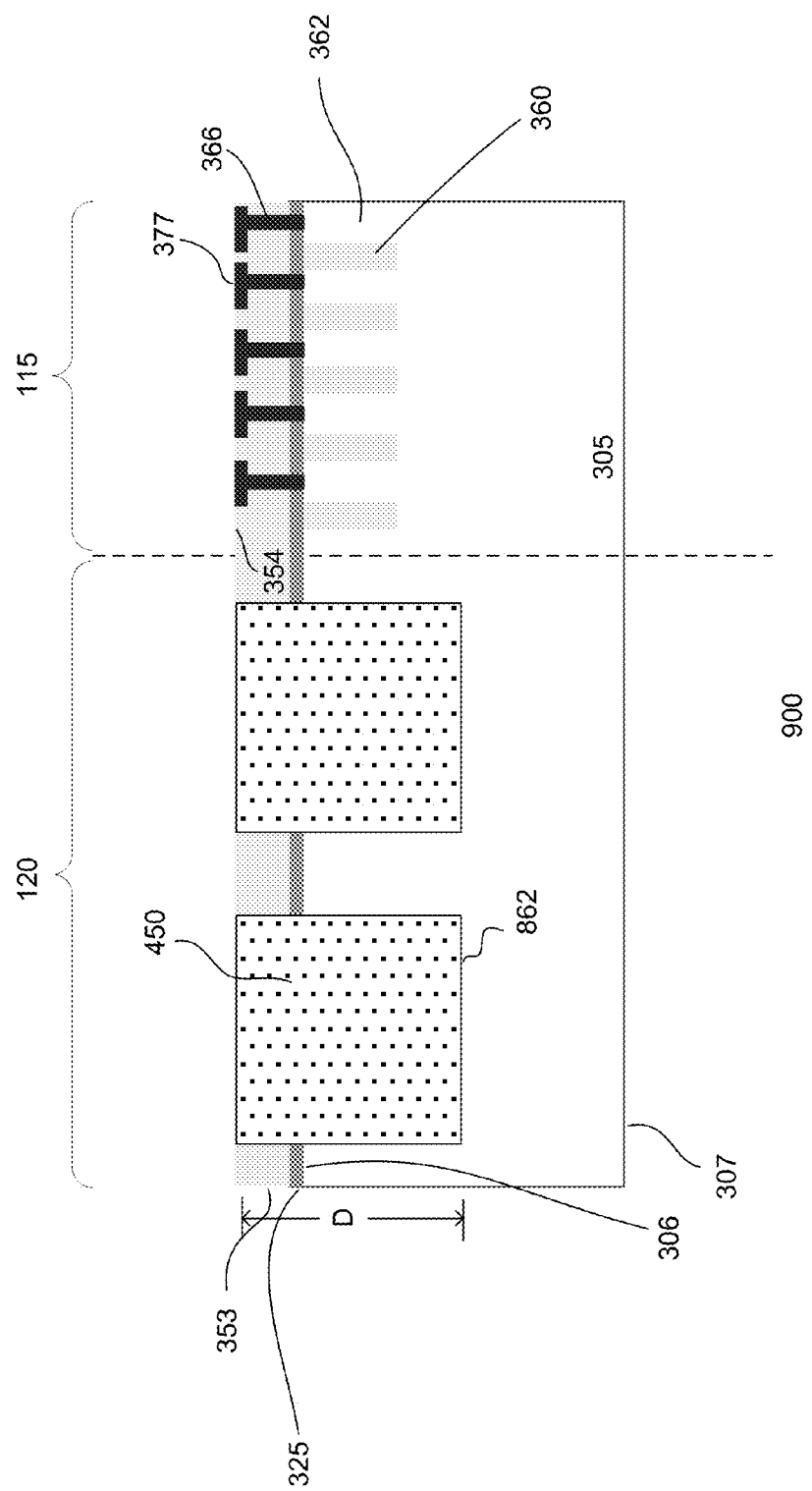

As shown in FIG. 9f, a planarization process is performed, removing excess stress buffer material and etch stop layer to expose the substrate surface. The planarization process produces a planar top surface with the substrate, stress buffers 450 and isolation regions. The planarization process, for example, includes CMP. Other type of planarization processes may also be useful. For example, the planarization process may include an etch back process. The etch back process may be a wet etch or dry etch. The etch back process, for example, may be employed to remove the excess material when the surface is flat or substantially flat. In other embodiments, a combination of CMP and etch back process may be employed. For example, a CMP is employed first to planarize the surface followed by an etch back process.

Figure 9G:
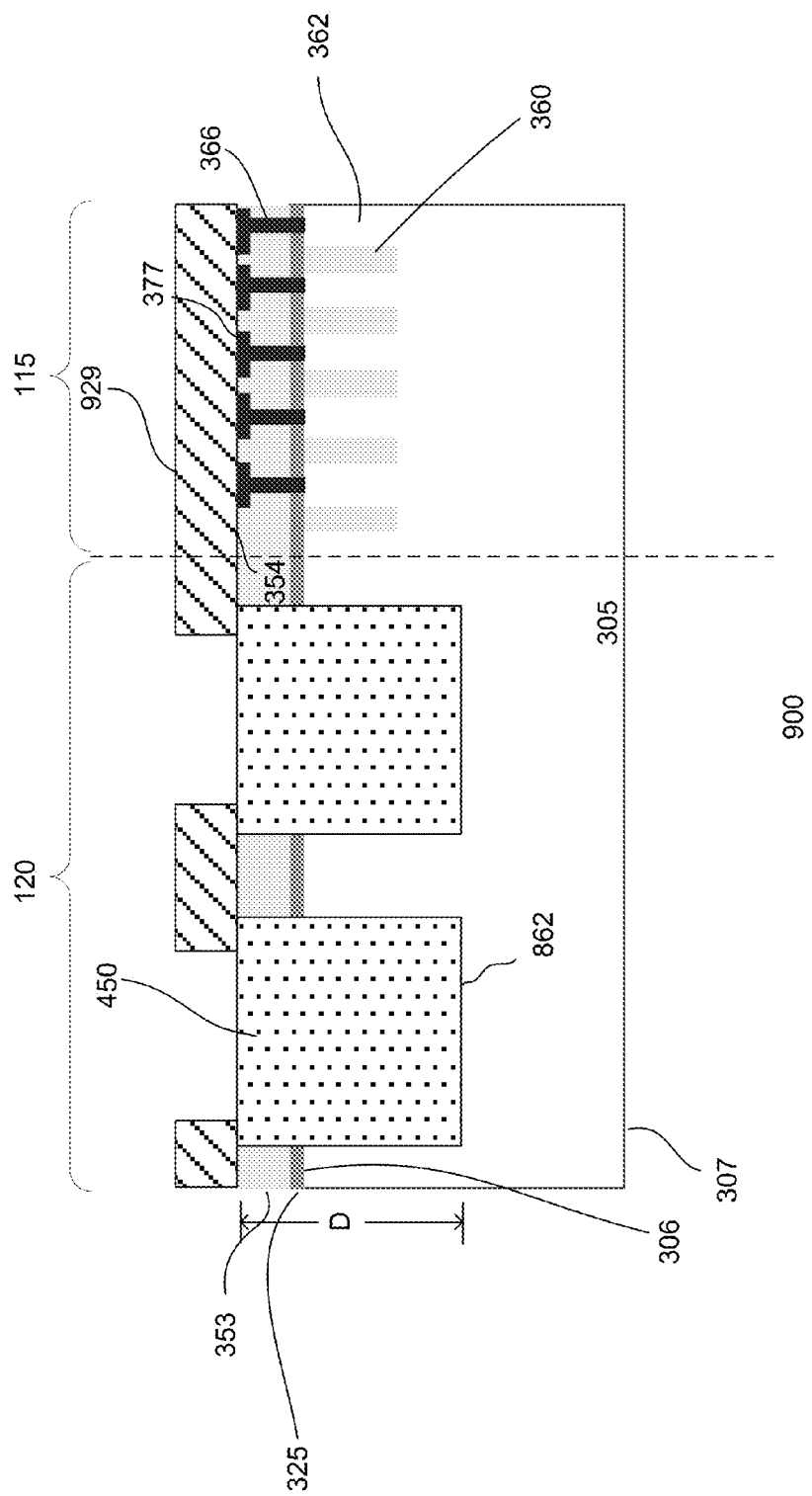

In FIG. 9g, a mask 929 is formed on the substrate. The mask is patterned to expose regions where TSV contact vias are to be formed. In one embodiment, the mask is patterned using the TSV contact mask, except that it is printed with a smaller or smallest CD. Printing with a smaller CD ensures that the openings in the mask for the TSV vias are within the TSV stress buffers.

Figure 9H:
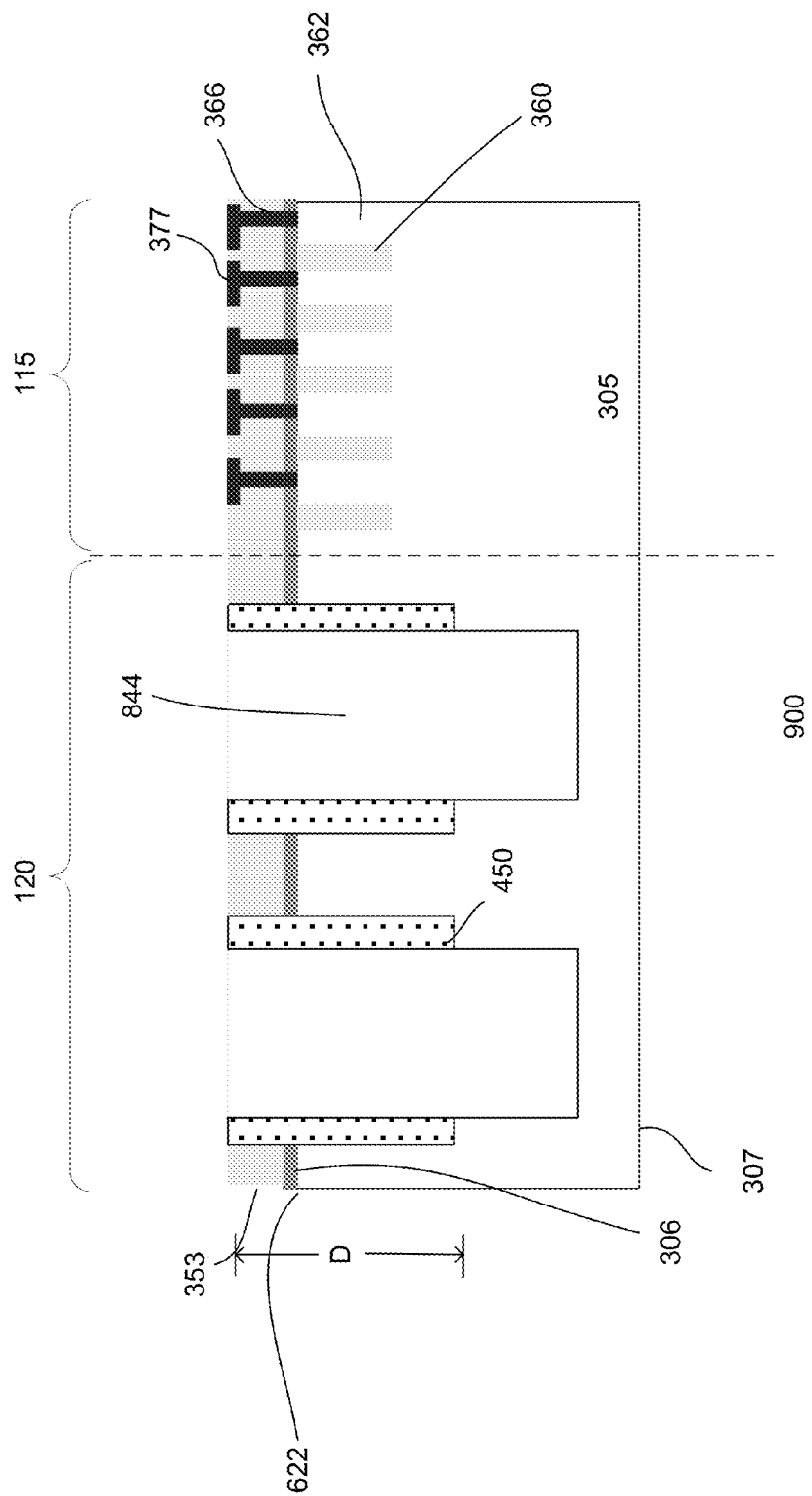
Figure 9I:
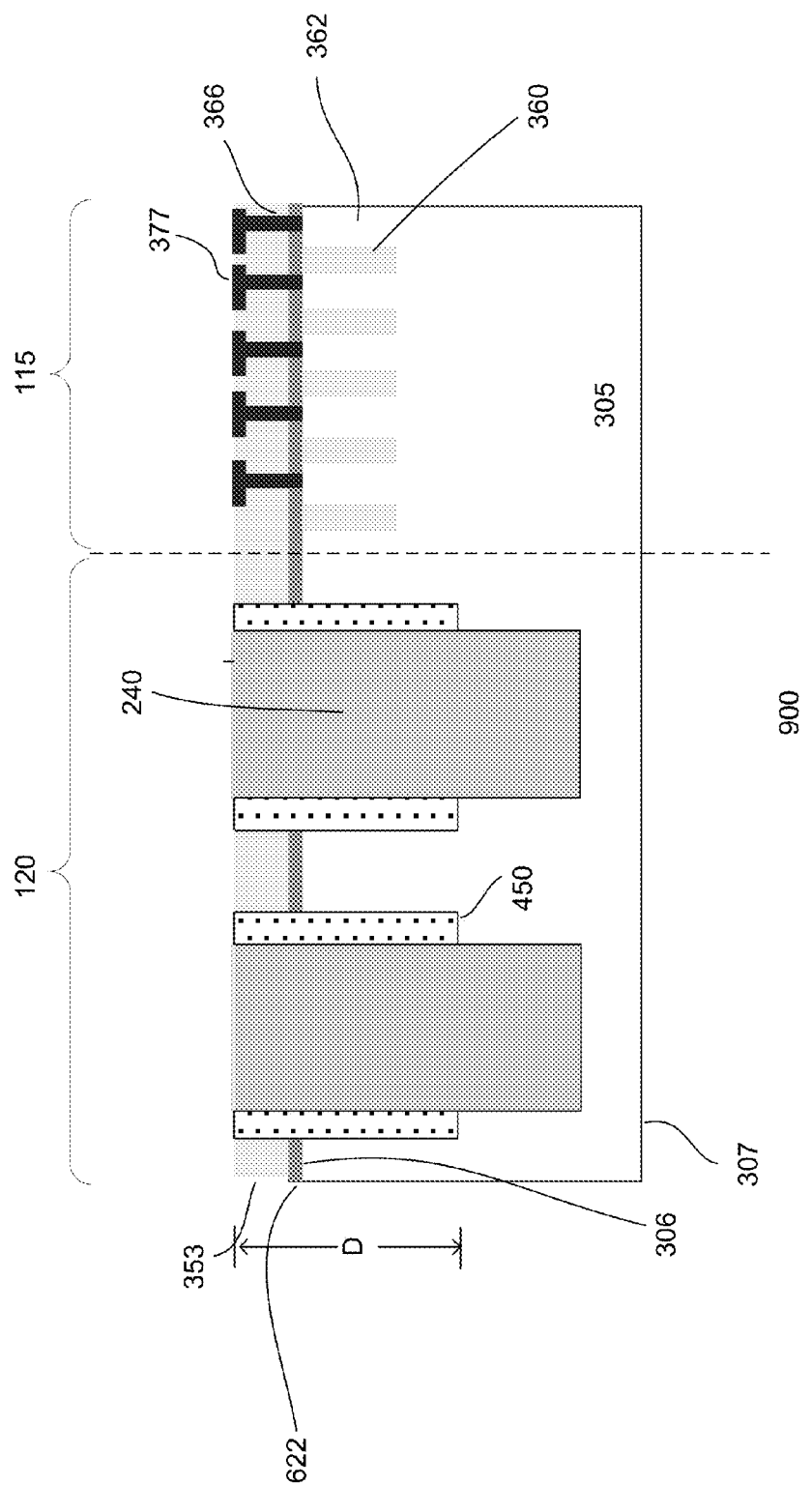

Referring to FIG. 9h, TSV contact vias are formed in the TSV region unprotected by the mask openings. The exposed portions of the TSV region may be patterned by, for example, a deep RIE (DRIE) process using the patterned mask to form the TSV contact vias 844. In one embodiment, the TSV contact vias do not extend through the substrate. The depth of the TSV contact vias, for example, should be greater than or the same as the final thickness of the substrate. In one embodiment, the depth of the TSV contact vias is different than the depth of the stress buffers. The depth of the TSV contact vias, in one embodiment, is greater than the depth of the stress buffers. In one embodiment, the depth of the TSV contact vias is about 5 to 200 μm. Other depth dimensions for the TSV contact vias may also be useful.

The TSV contact vias are cleaned. The process may continue to form TSV contacts. In one embodiment, the process continues by forming various types of liners on the walls of the TSV vias. For example, a diffusion barrier or isolation layer may be formed on the walls of the TSV vias. The isolation layer, for example, may include a dielectric material such as $SiO_2$. Other materials, such as SiN, may also be used. The isolation layer may be formed by CVD. Other techniques for forming the isolation layer may also be useful. One or more liners may be formed over the isolation layer. For example, a liner, such as Ti, Ta, TiN, TaN, Ru, W or a combination thereof, may be formed over the isolation layer. The liner or liners may be formed by, for example, PVD or ALD. Other techniques for forming the liners may also be useful.

After the liners are formed, the vias are filled with a conductive material. The conductive material, in one embodiment, includes copper (Cu). Other types of conductive materials may also be useful. The Cu can be deposited by plating techniques, such as electro or electroless plating. Other techniques for filling the vias with conductive materials may also be useful. When plating is employed, a Cu seed layer is first formed on the walls of the TSV vias. The seed layer may be formed by, for example, PVD. Thereafter, the Cu is plated over the seed layer to fill the TSV vias. Other techniques may also be used to fill the TSV contact vias. Excess conductive material on the surface of the ILD layer is removed. For example, the excess conductive material is removed by CMP, forming a planar surface with the ILD layer, interconnects and TSV contacts.

The process continues to form the device. In one embodiment, the process continues with multi-layer metallization process such as forming M1, V1, M2, etc., over the ILD layer until the top layer of the device. The substrate is thinned to the desired thickness by removing materials from the second surface of the substrate. The substrate, for example, is thinned by grinding and the excess material of the substrate, for example, is removed by an etch. For example, a dry or wet etch may be employed to remove the excess material from the second surface of the substrate. After the substrate has been thinned to the desired thickness, the TSV contacts are exposed. The process continues by forming a conductive trace to bond the TSV contacts. The process continues to complete the formation of the device.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a semiconductor substrate having first and second major surfaces, the substrate includes first and second isolation trenches disposed on the first major surface in first and second substrate regions of the substrate, the isolation trenches extend partially through the substrate, wherein the trenches are filled with isolation material;
   removing the isolation material from the first isolation trench to form a first stress buffer trench while the isolation material remains in the second isolation trench to form an isolation region;
   filling the first stress buffer trench with a stress buffer material to form a stress buffer in the first substrate region; and
   forming a through silicon via (TSV) contact in the first substrate region, the TSV contact has first and second portions, the second portion extends beyond a bottom of the stress buffer, wherein the stress buffer completely surrounds the first portion of the TSV contact and alleviates stress created by the difference in coefficient of thermal expansion (CTE) between the TSV contact and the semiconductor substrate.

2. The method of claim 1 comprising further etching the first isolation trench after removing the isolation material to increase a depth of the first isolation trench prior to filling it with the stress buffer material, the first isolation trench serves as the first stress buffer trench.

3. The method of claim 2 wherein:
   a bottom of the TSV contact does not extend to the second major surface of the substrate; and
   backgrinding the second major surface of the substrate to expose the bottom of the TSV contact.

4. The method of claim 2 further comprising:
   forming an ILD layer on the first major surface of the semiconductor substrate; and
   forming the TSV contact in the first substrate region through the ILD layer and the semiconductor substrate.

5. The method of claim 4 wherein:
   a bottom of the TSV contact does not extend to the second major surface of the substrate; and
   backgrinding the second major surface of the substrate to expose the bottom of the TSV contact.

6. The method of claim 1 wherein the first major surface of the semiconductor substrate comprises an ILD layer, and comprising:
   patterning the ILD layer to form an ILD opening, wherein the ILD opening exposes the first isolation trench filled with the isolation material;
   removing the isolation material from the first isolation trench, the first isolation trench serves as the first stress buffer trench;
   filling the first stress buffer trench and ILD opening with the stress buffer material to form the stress buffer in the first substrate region and the ILD layer;
   planarizing to remove excess stress buffer material over the ILD layer; and
   forming the TSV contact in the first substrate region through the ILD layer and the semiconductor substrate.

7. The method of claim 6 wherein:
a bottom of the TSV contact does not extend to the second major surface of the substrate; and
backgrinding the second major surface of the substrate to expose the bottom of the TSV contact.

8. The method of claim 1 wherein the stress buffer is displaced from the TSV contact.

9. The method of claim 8 wherein the stress buffer material comprises material having elastic modulus less than about 100 GPa.

10. The method of claim 8 wherein the stress buffer material comprises polymer, plastic, organic or inorganic dielectrics, porous dielectric material or a combination thereof.

11. The method of claim 8 wherein the stress buffer material is deposited by spin-on techniques, chemical vapor deposition or sol-gel method.

12. The method of claim 1 wherein the TSV contact is formed through the stress buffer and the first portion of the TSV contact abuts the stress buffer.

13. The method of claim 12 wherein the stress buffer material comprises material having elastic modulus less than about 100 GPa.

14. The method of claim 12 wherein the stress buffer material comprises polymer, plastic, organic or inorganic dielectrics, porous dielectric material or a combination thereof.

15. The method of claim 12 wherein the stress buffer material is deposited by spin-on techniques, chemical vapor deposition or sol-gel method.

16. The method of claim 1 further comprising a plurality of stress buffers and a plurality of TSV contacts.

17. A method for forming a device comprising:
providing a semiconductor substrate having first and second major surfaces, the substrate includes a first isolation trench disposed on the first major surface in a first substrate region of the substrate, the first isolation trench extends partially through the semiconductor substrate, wherein the first isolation trench serves as a first stress buffer trench;
filling the first isolation trench with a stress buffer material to form a stress buffer in the substrate; and
forming a through silicon via (TSV) contact in the first substrate region, the TSV contact has first and second portions, the second portion extends beyond a bottom of the stress buffer, wherein the stress buffer material completely surrounds the first portion of the TSV contact and alleviates stress created by the difference in CTE between the TSV contact and the semiconductor substrate.

18. The method of claim 17, prior to filling the first isolation trench with the stress buffer material, comprising:
removing isolation material in the first isolation trench;
etching the first isolation trench to increase a depth of the first isolation trench; and
filling the first isolation trench with the stress buffer material to form the stress buffer.

19. The method of claim 17 further comprising:
forming an ILD layer on the first major surface of the semiconductor substrate; and
forming the TSV contact in the first region of the substrate through the ILD layer and the stress buffer in the semiconductor substrate.

20. The method of claim 17 wherein:
the first major surface of the semiconductor substrate comprises an ILD layer;
patterning the ILD layer to form an ILD opening to expose the first isolation trench, wherein the first isolation trench is filled with an isolation material;
removing the isolation material from the first isolation trench;
filling the first isolation trench and the ILD opening with the stress buffer material to form the stress buffer in the first isolation trench and the ILD opening;
planarizing to remove excess stress buffer material over the ILD layer; and
forming the TSV contact in the stress buffer.

21. The method of claim 17 wherein the stress buffer does not abut the TSV contact.

22. The method of claim 17 wherein:
forming the TSV contact comprises etching a TSV via through the stress buffer; and
the TSV contact abuts the stress buffer.

* * * * *